United States Patent
Yoon

(10) Patent No.: US 9,691,783 B2
(45) Date of Patent: Jun. 27, 2017

(54) SEMICONDUCTOR DEVICE AND METHOD OF MANUFACTURING THE SAME

(71) Applicant: SK hynix Inc., Gyeonggi-do (KR)

(72) Inventor: Myung Sung Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/258,782

(22) Filed: Apr. 22, 2014

(65) Prior Publication Data
US 2015/0155296 A1    Jun. 4, 2015

(30) Foreign Application Priority Data
Dec. 3, 2013  (KR) .................... 10-2013-0149335

(51) Int. Cl.
| | |
|---|---|
| H01L 27/11582 | (2017.01) |
| H01L 29/66 | (2006.01) |
| H01L 27/1157 | (2017.01) |
| H01L 29/792 | (2006.01) |

(52) U.S. Cl.
CPC .... *H01L 27/11582* (2013.01); *H01L 27/1157* (2013.01); *H01L 29/6656* (2013.01); *H01L 29/66833* (2013.01); *H01L 29/7926* (2013.01)

(58) Field of Classification Search
CPC ......... H01L 27/11582; H01L 27/11556; H01L 29/7926; H01L 27/1157; H01L 29/66833; H01L 2924/00; H01L 2924/0002; H01L 2924/00014; H01L 2224/13147; H01L 2224/13111
See application file for complete search history.

(56) References Cited

U.S. PATENT DOCUMENTS

| | | | | |
|---|---|---|---|---|
| 2011/0018052 A1* | 1/2011 | Fujiwara | ........... | H01L 27/11551 257/324 |
| 2011/0291177 A1* | 12/2011 | Lee et al. | ........ | 257/324 |
| 2012/0003800 A1* | 1/2012 | Lee | ........... | H01L 27/11551 438/261 |
| 2012/0139027 A1* | 6/2012 | Son et al. | ........ | 257/324 |
| 2012/0273867 A1* | 11/2012 | Ko et al. | ........ | 257/324 |

FOREIGN PATENT DOCUMENTS

KR        101263182        *  5/2013

* cited by examiner

*Primary Examiner* — Tony Tran
(74) *Attorney, Agent, or Firm* — IP & T Group LLP

(57) ABSTRACT

Provided is a semiconductor device including a first stacked structure in which first conductive patterns and first interlayer insulating layers are alternately stacked, a second stacked structure formed on the first stacked structure and including second conductive patterns and second interlayer insulating layers, which are alternately stacked, an interfacial pattern formed between the first stacked structure and the second stacked structure, first through-areas passing through the first stacked structure and the interfacial pattern, and including first protrusions protruding toward a sidewall of the interfacial pattern, second through-areas passing through the second stacked structure and connected to the first through-areas, and through-structures formed along sidewalls of the first through-areas and the second through-areas.

11 Claims, 17 Drawing Sheets

SEMICONDUCTOR DEVICE AND METHOD OF MANUFACTURING THE SAME

CROSS-REFERENCE TO RELATED APPLICATION

The present application claims priority of Korean patent application number 10-2013-0149335, filed on Dec. 3, 2013, in the Korean Intellectual Property Office, the entire disclosure of which is incorporated herein by reference in its entirety.

BACKGROUND

Field of the Invention

The present invention relates to a semiconductor device and a method of manufacturing the same. More specifically, the present invention relates to a semiconductor device including a cell string with a three-dimensional structure, and a method of manufacturing the same.

Description of Related Art

Generally, a cell string of a semiconductor device is formed in a two-dimensional structure in which memory cells are formed in a single layer on a substrate. The degree of integration of the two-dimensional cell string may be improved by reducing the planar area occupied by the memory cells using a micro-pattern forming technique.

As the technology for improving the degree of integration of the two-dimensional cell string reaches its limit, a three-dimensional cell string in which memory cells are formed in a multi-layer has been suggested. The degree of integration of the three-dimensional cell string may be improved without reducing the planar area occupied by the memory cells.

The three-dimensional cell string includes interlayer insulating layers and conductive patterns, which are alternately stacked, and a through-structure passing through the interlayer insulating layers and the conductive patterns. The through-structure may include a memory layer and a channel layer. As the number of stacks of the interlayer insulating layers and the conductive patterns increases, the difficulty of forming the through-structures increases. To solve this concern, a process of forming through-structures with reduced difficulty has been proposed as follows.

The proposed process for forming through-structures includes forming a first stacked structure with portions of interlayer insulating layers and conductive patterns, forming a first part of a through-structure passing through the first stacked structure, forming a second stacked structure also having interlayer insulating layers and conductive patterns on the first stacked structure including the first part of the through-structure, and forming a second part connected to the first part of the through-structure through the second stacked structure. Likewise, when the through-structure is formed in parts divided by height, an overlay margin between the first part and the second part is insufficient, which may result in a process failure in which the second part is not connected to the first part. Additionally, when the second part of the through-structure is formed, the first stacked structure may be damaged.

As described above, there are many difficulties in performing the process of forming through-structures passing through multi-layered material layers.

SUMMARY

The present invention is directed to a semiconductor device in which a through-structure passing through multi-layered material layers may easily formed, and a method of manufacturing the same.

According to an embodiment of the present invention, a semiconductor device is provided including a first stacked structure in which first conductive patterns and first interlayer insulating layers are alternately stacked, a second stacked structure formed on the first stacked structure and having second conductive patterns and second interlayer insulating layers which are alternately stacked, an interfacial pattern formed between the first stacked structure and the second stacked structure, first through-areas passing through the first stacked structure and the interfacial pattern and having first protrusions protruding toward a sidewall of the interfacial pattern, second through-areas passing through the second stacked structure and connected to the first through-areas, and through-structures formed along sidewalls of the first through-areas and the second through-areas.

According to another embodiment of the present invention, a method of forming a semiconductor device is provided including alternately stacking first material layers and second material layers, forming a third material layer on the first material layers and the second material layers, forming a first through-area passing through the first to third material layers and including a first protrusion which protrudes toward a sidewall of the third material layer, filling the first through-area with a first sacrificial layer, forming fourth material layers and fifth material layers which are alternately stacked on the third material layer, forming a second through-area passing through the fourth material layers and the fifth material layers and exposing the first sacrificial layer, removing the first sacrificial layer through the second through-area, and forming a through-structure along the second through-area and the first through-area.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which.

DESCRIPTION OF EMBODIMENTS

Figure 1A:
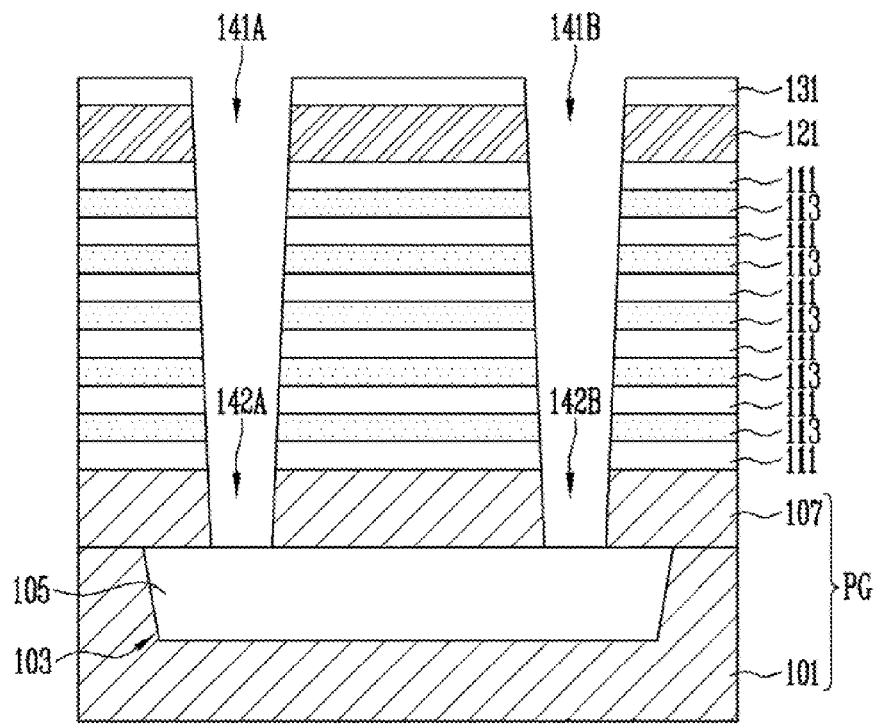
FIGS. 1A to 1F are cross-sectional views illustrating a semiconductor device according to a first embodiment of the present invention, and a method of manufacturing the same.

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

All terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. It should be understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

FIGS. 1A to 1F are cross-sectional views illustrating a semiconductor device according to a first embodiment of the present invention, and a method of manufacturing the same.

Referring to FIG. 1A, a pipe gate PG in which a first sacrificial layer 105 is buried is formed on a substrate (not shown). A process of forming the pipe gate PG includes forming a first pipe gate layer 101 on the substrate covered with an insulating layer (not shown), forming a trench 103 by etching the first pipe gate layer 101, filling the trench 103 with the first sacrificial layer 105, and forming a second pipe gate layer 107 on the first pipe gate layer 101 filled with the first sacrificial layer 105. The first and second pipe gate layers 101 and 107 may be formed of a conductive material, for example, silicon. The first sacrificial layer 105 may be formed of a material having an etch selectivity different from the etch selectivities of the first and second pipe gate layers 101 and 107. For example, the first sacrificial layer 105 may be formed of a titanium nitride (TiN) layer.

Next, first material layers 111 and second material layers 113 are alternately stacked on the pipe gate PG filled with the first sacrificial layer 105. The first material layers 111 and the second material layers 113 may be formed of various materials. For example, the first material layers 111 may be formed of an insulating material for forming an interlayer insulating layer, and the second material layers 113 may be formed of a sacrificial material having an etch selectivity different from that of the first material layers 111. In this case, the first material layers 111 may be formed of silicon oxide layers, and the second material layers 113 may be formed of nitride layers. For another example, the first material layers 111 may be formed of an insulating material for forming an interlayer insulating layer, and the second material layers 113 may be formed of a conductive material.

Next, a third material layer 121 may be formed on the first material layers 111 and the second material layers 113. The third material layer 121 may be formed of various materials having an etch selectivity different from etch selectivities of the first material layers 111 and the second material layers 113. For example, when the first material layers 111 are formed of silicon oxide layers and the second material layers 113 are formed of nitride layers, the third material layer 121 may be formed of a conductive material. Silicon may be used as the conductive material for forming the third material layer 121. For another example, when the first material layers 111 are formed of an insulating material and the second material layers 113 are formed of a conductive material, the third material layer 121 may be formed of an insulating material for forming a sacrificial material layer, or a conductive material for forming a sacrificial material layer. For example, the first material layers 111 are formed of silicon oxide layers, the second material layers 113 are formed of silicon layers, and the third material layer 121 may be formed of a nitride layer.

Next, a protection layer 131 may be formed on the third material layer 121. The protection layer 131 may be formed to prevent loss of thickness of the third material layer 121 during a subsequent etching process in which sidewalls of the third material layer 121 are selectively etched. The protection layer 131 may be formed of the same material layer as the first material layers 111, and used as an interlayer insulating layer. In some cases, the process of forming the protection layer 131 may be omitted.

Next, first through-areas 141A and 141B passing through the protection layer 131, the third material layer 121, the first material layers 111, and the second material layers 113, are formed. At this time, preliminary interconnections 142A and 142B, connected to the first through-areas 141A and 141B and exposing the first sacrificial layer 105, are formed by further etching the second pipe gate layer 107. Horizontal cross-sections of the first through-areas 141A and 141B and the preliminary interconnections 142A and 142B may be formed in various shapes, such as a circle, an ellipse, and a polygon. The first through-areas 141A and 141B are also referred to as a drain-side first through-area 141A connected to the trench 103, and a source-side first through-area 141B connected to the trench 103, respectively.

Figure 1B:
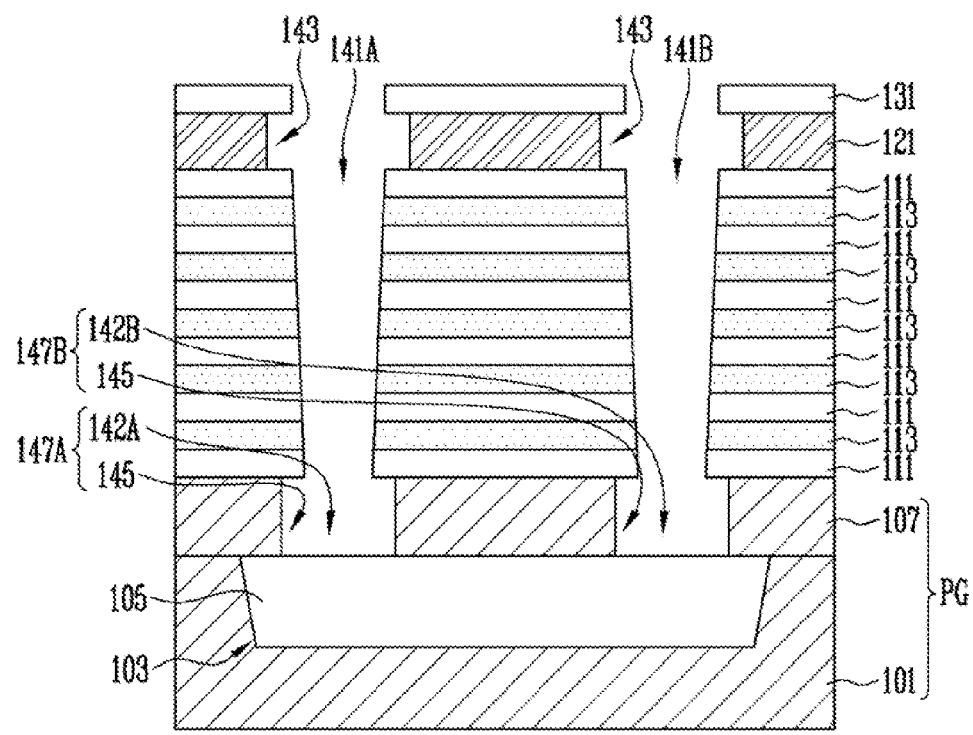

Referring to FIG. 1B, first protrusions 143 are formed on sidewalls of the first through-areas 141A and 141B by selectively etching sidewalls of the third material layer 121 exposed through the first through-areas 141A and 141B. The first protrusions 143 are formed in such a manner that parts of the sidewalls of the first through-areas 141A and 141B in contact with the entire sidewalls of the third material layer 121 protrude toward the third material layer 121. The first through-areas 141A and 141B are formed to have a greater width in parts in which the first protrusions 143 are formed than in the other parts in which the first protrusions 143 are not formed. The process of etching the sidewalls of the third material layer 121 may be performed in various ways such as a wet etching method or a dry etching method. While etching the sidewalls of the third material layer 121, sidewalls of the second pipe gate layer 107 exposed through the preliminary interconnections 142A and 142B may be etched to form second protrusions 145 on sidewalls of the preliminary interconnections 142A and 142B. The second protrusions 145 are formed in such a manner that the entire sidewalls of the preliminary interconnections 142A and 142B in contact with the second pipe gate layer 107 protrude toward the second pipe gate layer 107. Since the second protrusions 145 are formed on the sidewalls of the preliminary interconnections 142A and 142B, interconnections 147A and 147B have a greater width than that of the lower parts of the first through-areas 141A and 141B. Since the interconnections 147A and 147B are formed to have a greater width, the distance between the interconnections 147A and 147B may be formed smaller. The interconnections 147A and 147B are also referred to as a drain-side interconnection 147A, connected to the drain-side first through-area 141A and a source-side interconnection 147B connected to the source-side first through-area 141B, respectively. On the other hand, unlike described above, when the third material layer 121 has an etch selectivity different from that of the second pipe gate layer 107, the second protrusions 145 are not formed, and the widths of the preliminary interconnections 142A and 142B may remain.

Figure 1C:
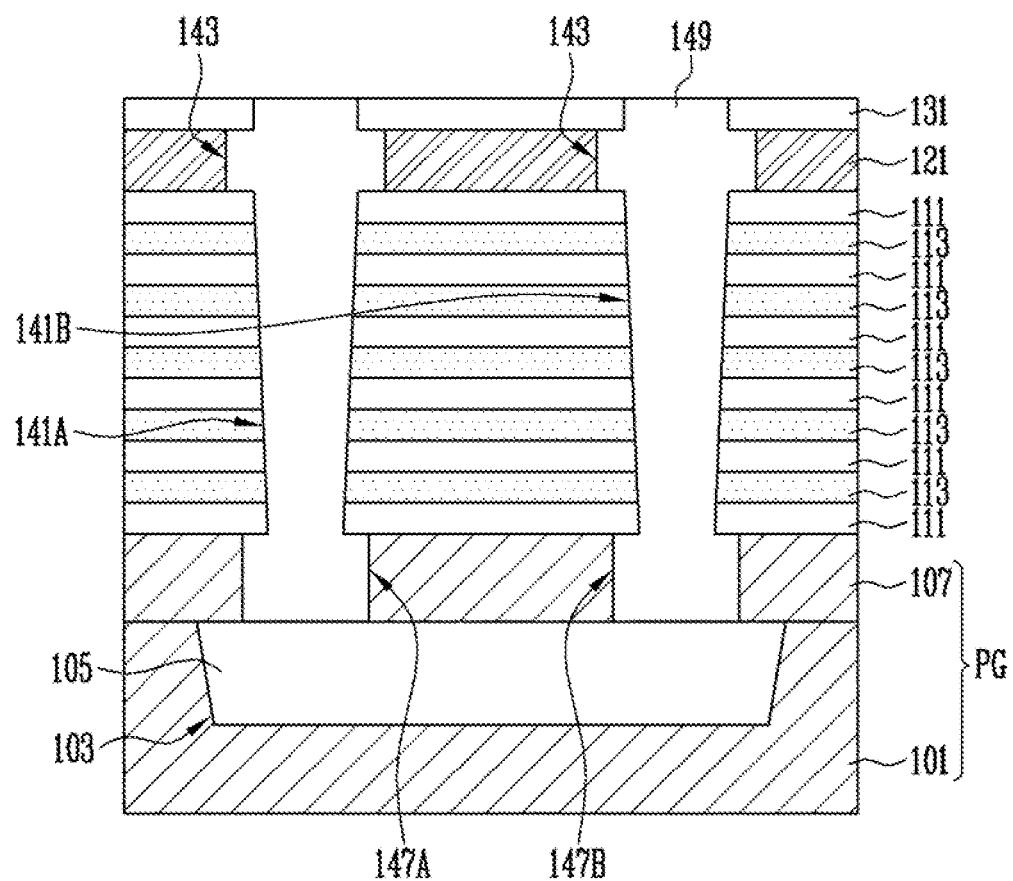

Referring to FIG. 1C, the insides of the first through-areas 141A and 141B including the first protrusions 143 and the insides of the interconnections 147A and 147B are filled with second sacrificial layers 149. The second sacrificial layers 149 may be formed of a material having an etch selectivity different from etch selectivities of the first to third material layers 111, 113, and 121, and may be formed of the same material layer as the first sacrificial layer 105. For example, the second sacrificial layers 149 may be formed of titanium nitride (TiN), tungsten (W), or the like.

Figure 1D:
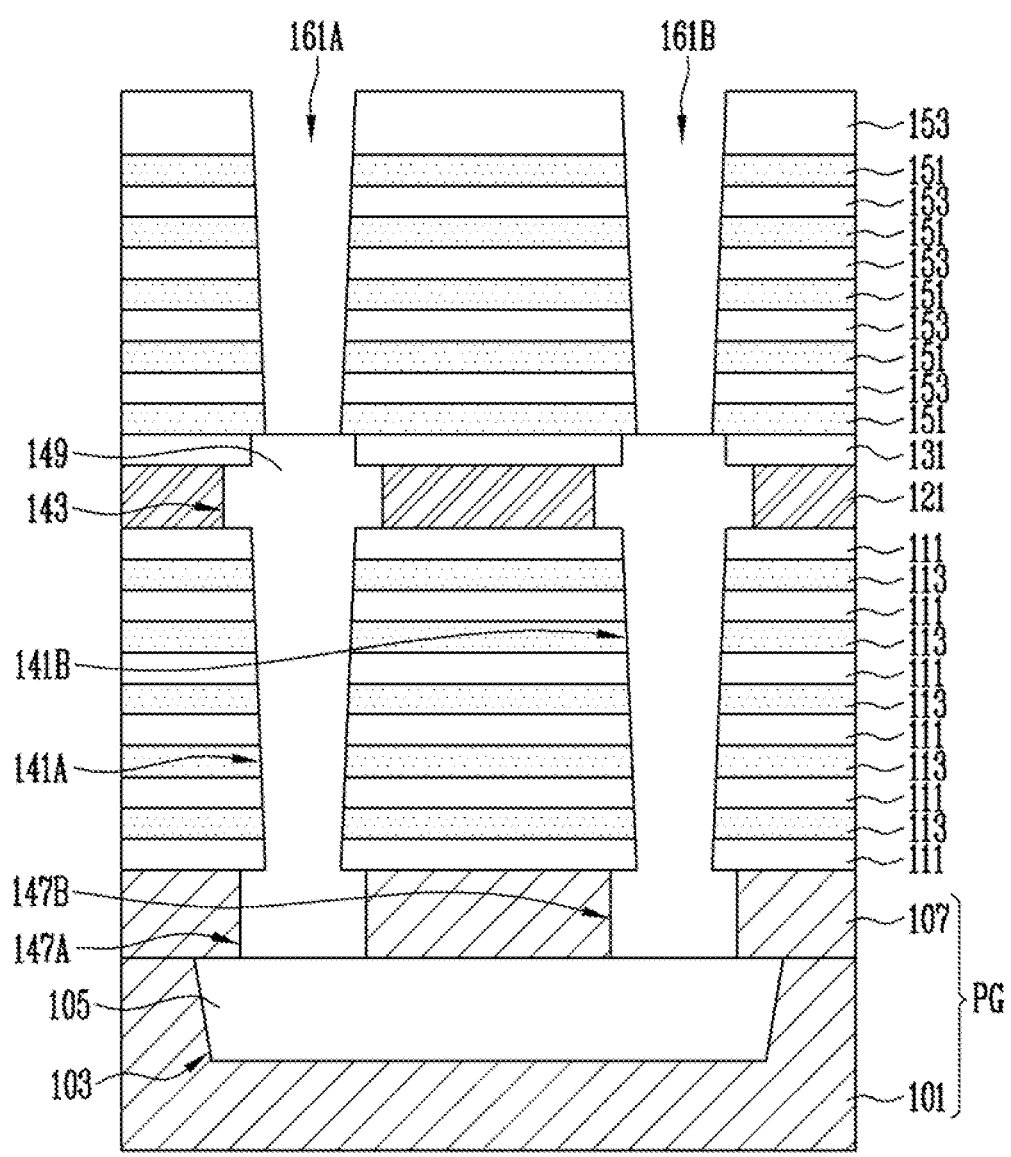

Referring to FIG. 1D, fourth material layers 151 and fifth material layers 153 are alternately stacked on the resulting structure shown in FIG. 1C, including the first material layers 111, the second material layers 113, and the third material layer 121, through which the second sacrificial layers 149 passes. The fourth material layers 151 may be formed of the same material as the second material layers 113, and the fifth material layers 153 may be formed of the same material as the first material layers 111.

Next, second through-areas 161A and 161B connected to the first through-areas 141A and 141B, which pass through the fourth material layers 151 and the fifth material layers 153, are formed by etching the fourth material layers 151 and the fifth material layers 153. Horizontal cross-sections of the second through-areas 161A and 161B may be formed in various shapes, such as a circle, an ellipse, and a polygon. The second through-areas 161A and 161B expose the second sacrificial layers 149. The second through-areas 161A and 161B are also referred to as a drain-side second through-area 161A connected to the drain-side first through-area 141A, and a source-side second through-area 161B connected to the source-side first through-area 141B, respectively.

The above-described second through-areas 161A and 161B are formed in a state in which parts of the first through-areas 141A and 141B are widened by the first protrusions 143. According to the first embodiment of the present invention, overlay margins between the second through-areas 161A and 161B and the first through-areas 141A and 141B are enlarged, and thereby the second through-areas 161A and 161B may be easily connected to the first through-areas 141A and 141B. In addition, according to the first embodiment of the present invention, since the overlay margins between the second through-areas 161A and 161B and the first through-areas 141A and 141B may be enlarged, damage of the first and second material layers 111 and 113 around the first through-areas 141A and 141B due to the etching process for forming the second through-areas 161A and 161B may be prevented.

Figure 1E:
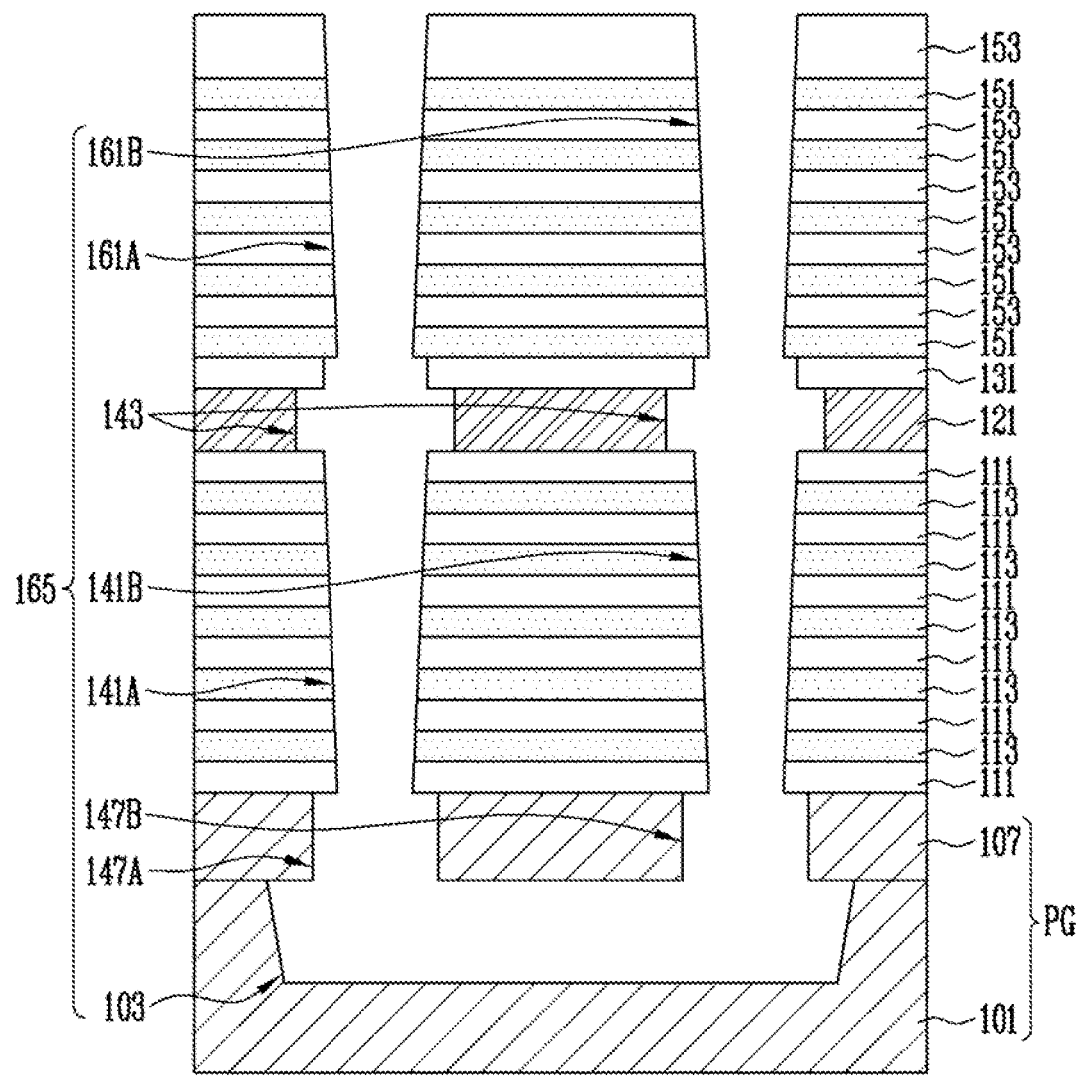

Referring to FIG. 1E, the first through-areas 141A and 141B including the first protrusions 143, the interconnections 147A and 147B, and the trench 103 are opened by selectively etching the exposed second sacrificial layers 149 and first sacrificial layer 105. Therefore, a through-hole 165 including the second through-areas 161A and 161B, the first through-areas 141A and 141B including the first protrusions 143, the interconnections 147A and 147B, and the trench 103 may be formed.

According to the first embodiment of the present invention, parts of the through-hole 165 passing through the first to fifth material layers 111, 113, 121, 151, and 153 are divided into the first through-areas 141A and 141B and the second through-areas 161A and 161B, according to height. Accordingly, in the first embodiment of the present invention, each of lower parts of the first and second through-areas 141A, 141B, 161A, and 161B may be formed to have a large width. In particular, in the first embodiment of the present invention, each of lower parts of the first through-areas 141A and 141B adjacent to the trench 103 may be formed to have a large width.

Figure 1F:
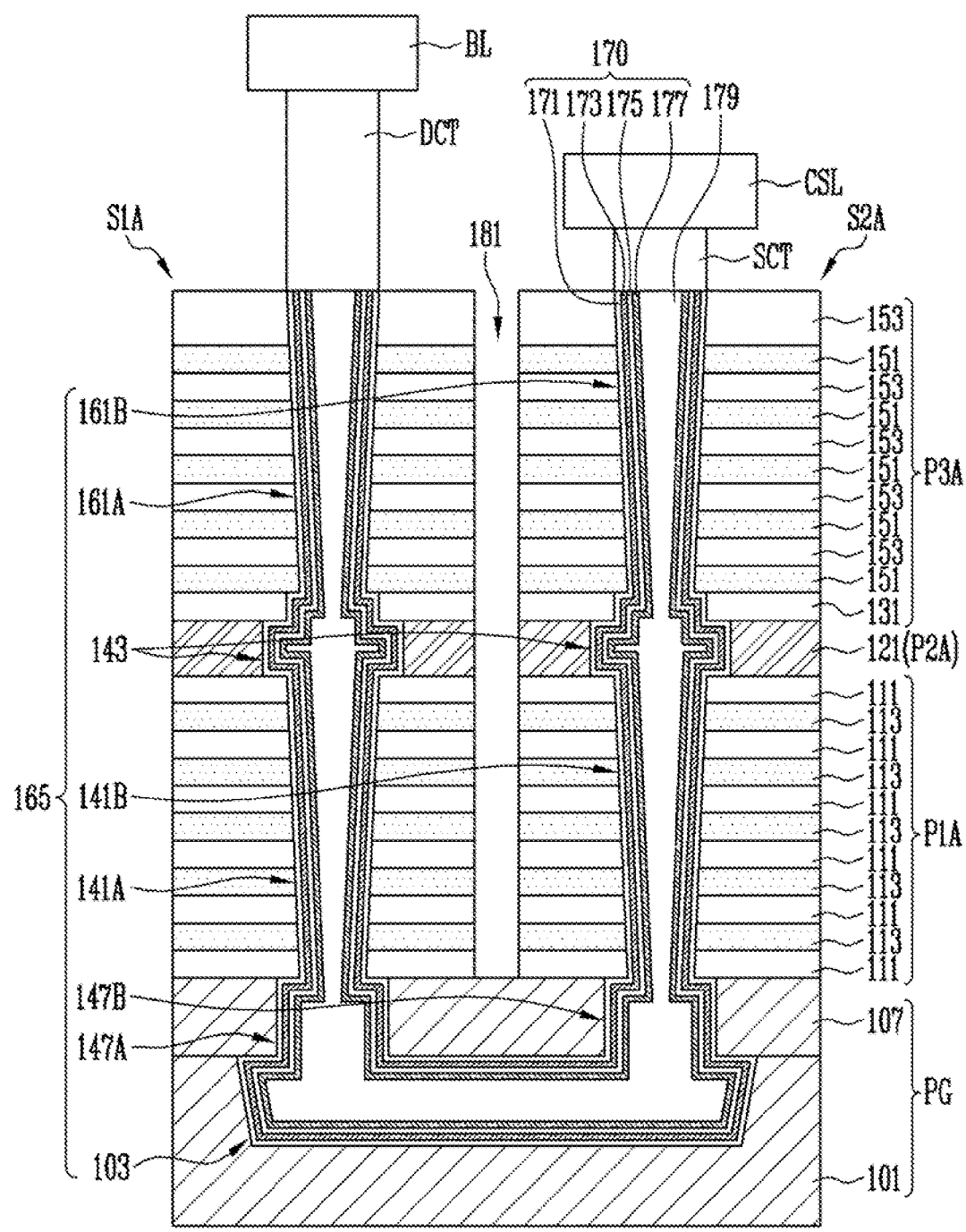

Referring to FIG. 1F, a through-structure 170 is formed along the surface of the through-hole 165. While forming the third material layer 121, the thickness of the third material layer 121 may be formed greater than the thicknesses of parts of first, second, fourth, and fifth material layers disposed adjacent thereto. In this case, the formation of an air-gap within the first protrusions 143 may be prevented while forming the through-structures 170.

The through-structure 170 includes a blocking insulating layer 171 formed along the surface of the through-hole 165, a data storage layer 173 formed along the blocking insulating layer 171, a tunnel insulating layer 175 formed along the data storage layer 173, and a channel layer 177 formed along the tunnel insulating layer 175. The blocking insulating layer 171 is a material layer that functions to prevent charge transfer, for example, an oxide layer. The data storage layer 173 is a material layer that may trap charges, for example, a silicon nitride layer. The tunnel insulating layer 175 is an energy barrier layer for F-N (Fowler-Norheim) tunneling, and may be formed of a silicon oxide layer, for example. The channel layer 177 may be formed of a semiconductor layer, for example, a silicon layer. The channel layer 177 may be formed to have a hollow tube shape, or formed to fill the inside of the through-hole 165. When the channel layer 177 is formed to have the hollow tube shape, the center of the channel layer 177 may be filled with an insulating material 179.

As described above, since the through-structure 170 is formed without being divided into parts according to height in the first embodiment of the present invention, the through-structure 170 may be easily formed. In addition, according to the first embodiment of the present invention, the width of each of the lower parts of the first and second through-areas 141A, 141B, 161A, and 161B, and a width of each of the interconnections 147A and 147B between the trench 103 and the first through-areas 141A and 141B are formed to be large. Thereby, in the first embodiment of the present invention, narrowness of the through-structure 170 in each of the lower parts of the first and second through-areas 141A, 141B, 161A, and 161B, and in the interconnections 147A and 147B may be prevented. Accordingly, clogging of the first and second through-areas 141A, 141B, 161A, and 161B, and the interconnections 147A and 147B by the through-structure 170, before the through-structure 170 is formed in the trench 103, may be prevented. Therefore, the through-structure 170 in accordance with the first embodiment of the present invention may be easily formed to the inside of the trench 103.

Next, a slit 181, passing through the fourth and fifth material layers 151 and 153, between the second through-areas 161A and 161B, through the first to third material layers (111, 113, and 121), between the first through-areas 141A and 141B, and through the protection layer 131, is formed.

The subsequent processes may be variously modified depending on material properties of the first to fifth material layers 111, 113, 121, 151, and 153.

When the first material layers 111 and the fifth material layers 153 are formed of an insulating material for an interlayer insulating layer, the second material layers 113 and the fourth material layers 151 are formed of a conductive material, and the third material layer 121 is formed of a conductive material or an insulating material, the subsequent process, such as a process of filling the inside of the slit 181 with an insulating material (not shown), a process of forming a source contact plug SCT, a process of forming a source line CSL, a process of forming a drain contact plug DCT, and a process of forming a bit line BL, may be performed.

The above-described semiconductor device in accordance with the first embodiment of the present invention includes a first stacked structure P1A in which interlayer insulating layers formed of the first material layers 111 and conductive patterns formed of the second material layers 113 are alternately stacked, a second stacked structure P3A in which interlayer insulating layers formed of the protection layer 131 and the fifth material layers 153 and conductive patterns formed of the fourth material layers 151 are alternately stacked, an interfacial pattern P2A formed of the third material layer 121 between the first stacked structure P1A and the second stacked structure P3A, a first pipe gate layer 101 formed under the first stacked structure P1A, and a second pipe gate layer 107 formed between the first pipe gate layer 101 and the first stacked structure P1A. The first stacked structure P1A, the interfacial pattern P2A, and the second stacked structure P3A may be separated into a drain-side stacked structure S1A and a source-side stacked structure S2A by the slit 181. In addition, the semiconductor device in accordance with the first embodiment of the present invention may further include a through-hole 165 passing through the source-side stacked structure S2A, the drain-side stacked structure S1A, and the pipe gate PG, and a through-structure 170 formed along the through-hole 165. The through-hole 165 includes first through-areas 141A and 141B passing through the first stacked structure P1A and the interfacial pattern P2A and including the first protrusions 143 protruding toward the interfacial pattern P2A, second through-areas 161A and 161B connected to the first through-areas 141A and 141B through the second stacked structure P3A, interconnections 147A and 147B having a greater width than or the same width as the first through-areas 141A and 141B and connected to the first through-areas 141A and 141B through the second pipe gate layer 107, and a trench 103 connected to the interconnections 147A and 147B in common and formed in the first pipe gate layer 101.

As described above, a cell string of the semiconductor device in accordance with the first embodiment of the present invention may be formed in a U-shape along the through-structure 170. The cell string may include a source select transistor, source-side memory cell transistors, a pipe transistor, drain-side memory cell transistors, and a drain select transistor, which are connected in series along the through-structure 170. At least one layer from the uppermost layer among the fourth material layers 151 of the drain-side stacked structure S1A may be used as a drain select line, and at least one layer from the uppermost layer among the fourth material layers 151 of the source-side stacked structure S2A may be used as a source select line. The drain select transistor may be formed at an intersection of a part of the through-structure 170 formed in the drain-side second through-area 161A and the drain select line. The drain-side memory cell transistors may be formed at intersections of parts of the through-structure 170 formed in the drain-side second through-area 161A and the fourth material layers 151 disposed under the drain select transistor, and at intersections of parts of the through-structure 170 formed in the drain-side first through-area 141A and the second material layers 113. The pipe transistor may be formed at an intersection of the pipe gate PG and the through-structure 170. The source select transistor may be formed at an intersection of a part of the through-structure 170 formed in the source-side second through-area 161B and the source select line. The source-side memory cell transistors may be formed at intersections of parts of the through-structure 170 formed in the source-side second through-area 161B and the fourth material layers 151 disposed under the source select transistor, and at intersections of parts of the through-structure 170 formed in the source-side first through-area 141B and the second material layers 113. An end of the channel layer 177 passing through the source-side stacked structure S2A may be connected to the source line CSL via the source contact plug SCT, and the other end of the channel layer 177 passing through the drain-side stacked structure S1A may be connected to the bit line BL via the drain contact plug DCT.

The drain-side memory cell transistors and the source-side memory cell transistors in accordance with the first embodiment of the present invention are connected by the pipe transistor. Parts of the channel layer 177 formed in the trench 103 between the interconnections 147A and 147B and in the interconnections 147A and 147B are used as a channel of the pipe transistor. According to the first embodiment of the present invention, since the distance between the interconnections 147A and 147B is reduced as described in FIG. 1B, a channel length of the pipe transistor formed between the interconnections 147A and 147B may be reduced. Accordingly, in the first embodiment of the present invention, channel resistance of the pipe transistor that connects the source-side memory cell transistors and the drain-side memory cell transistors may be reduced. In addition, in the first embodiment of the present invention, the width of each of lower parts of the first and second through-areas 141A, 141B, 161A, and 161B and the width of each of the interconnections 147A and 147B may be formed to be large. Accordingly, in the first embodiment of the present invention, narrowness of the through-structure 170 in each of lower parts of the first and second through-areas 141A, 141B, 161A, and 161B, and in the interconnections 147A and 147B may be prevented. Accordingly, the through-structure 170 may be easily formed to the inside of the trench 103.

The interfacial pattern P2A in accordance with the first embodiment of the present invention is formed to surround the through-structure 170 that includes the blocking insulating layer 171, the data storage layer 173, the tunnel insulating layer 175, and the channel layer 177, as the second material layers 113 of the first stacked structure P1A and the fourth material layers 151 of the second stacked structure P3A surround the through-structure 170. In addition, the interfacial pattern P2A may be formed of an insulating material or a conductive material. When the interfacial pattern P2A is formed of a conductive material, transistors formed at intersections of the interfacial pattern P2A and the through-structure 170 may be used as memory cell transistors in accordance with the first embodiment of the present invention.

Figure 2A:
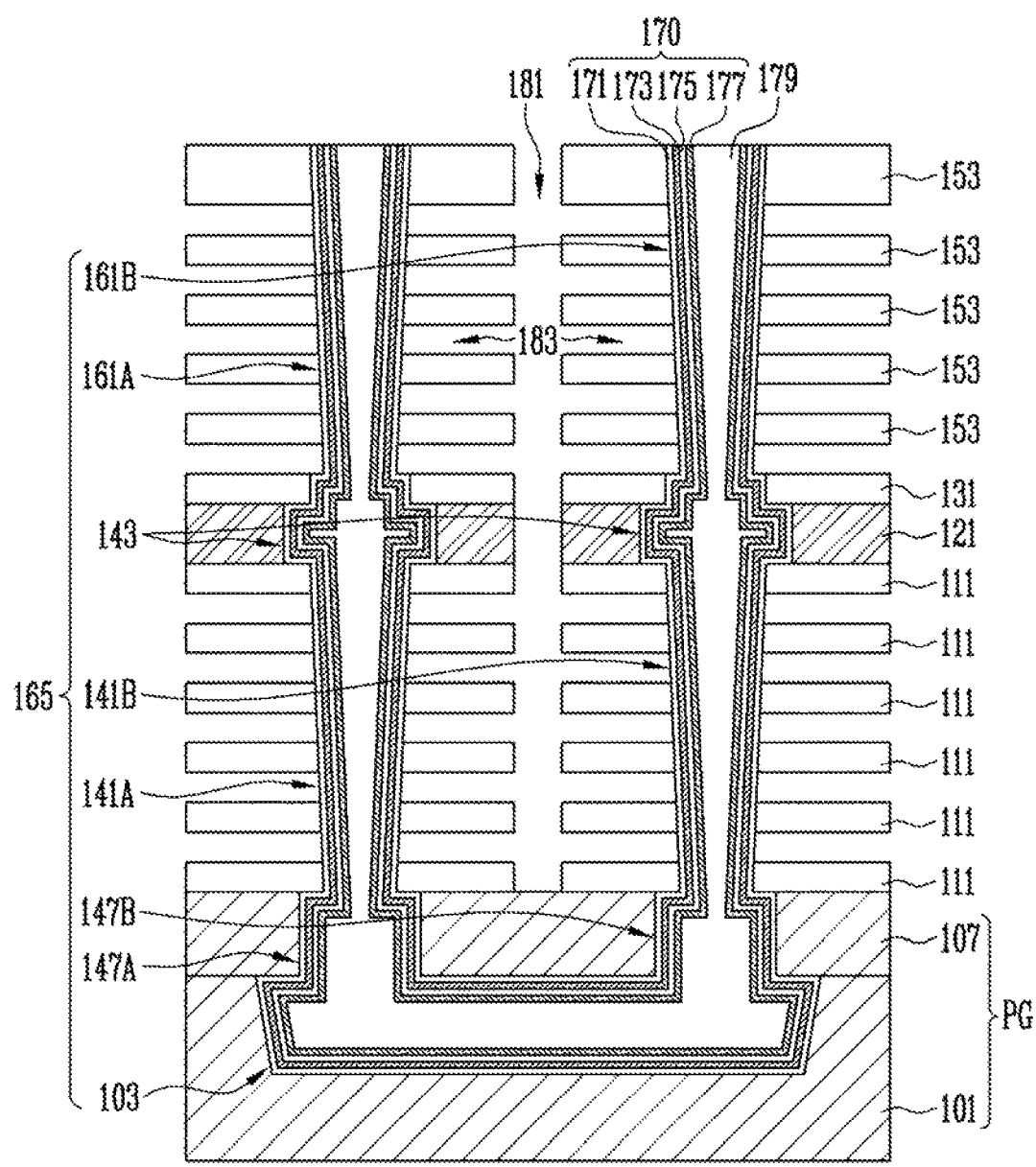
FIGS. 2A and 2B are cross-sectional views illustrating a semiconductor device according to a second embodiment of the present invention, and a method of manufacturing the same.
Figure 2B:
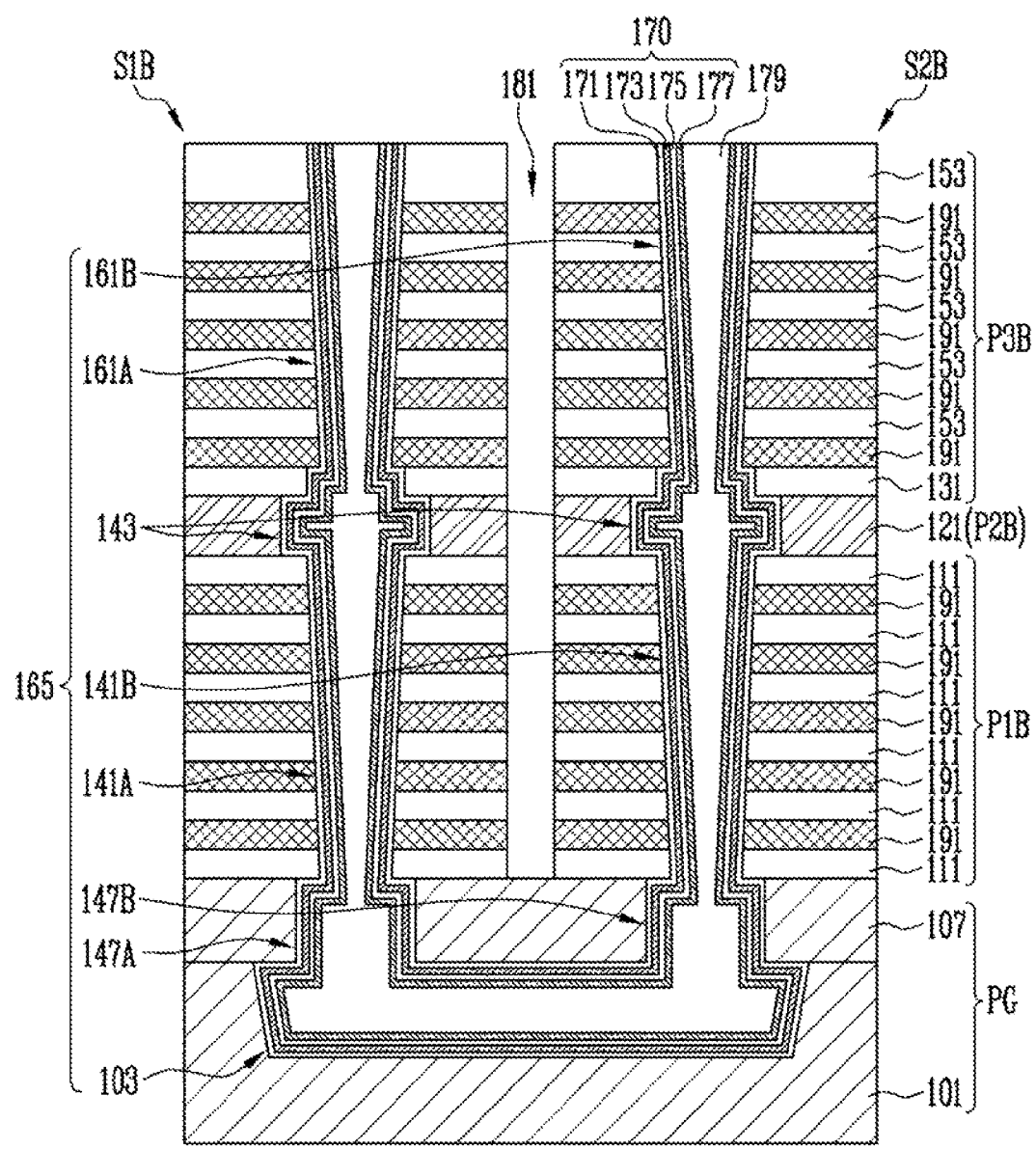

FIGS. 2A and 2B are cross-sectional views illustrating a semiconductor device and a method of manufacturing the same in accordance with a second embodiment of the present invention. In particular, FIGS. 2A and 2B are cross-sectional views illustrating other subsequent processes after the process of forming the slit 181 described in FIG. 1F. More specifically, FIGS. 2A and 2B shows an exemplary embodiment in which the first material layers 111 and the fifth material layers 153 are formed of an insulating material for an interlayer insulating layer, and the second material layers 113 and the fourth material layers 151 are formed of a sacrificial material. Among the reference numerals in FIGS. 2A and 2B, reference numerals indicating the same configurations as described in FIGS. 1A to 1F are the same as the reference numerals of FIGS. 1A to 1F. Hereinafter, detailed descriptions thereof will be omitted for convenience.

Referring to FIG. 2A, the process in accordance with the second embodiment of the present invention includes forming the slit 181, and forming recess areas 183 by selectively removing the second and fourth material layers 113 and 151, which are formed of the sacrificial material, exposed through the slit 181.

Referring to FIG. 2B, conductive patterns 191 are formed by filling the recess areas 183 with a conductive material. The conductive material for forming the conductive patterns 191 may be the same material as or a different material from the conductive material for forming the third material layer 121. For example, the conductive material for forming the conductive patterns 191 may be undoped silicon, doped silicon, a metal such as W, or a metal silicide layer.

The above-described semiconductor device in accordance with the second embodiment of the present invention includes a first stacked structure P1B in which interlayer insulating layers formed of the first material layers 111 and the conductive patterns 191 are alternately stacked, a second stacked structure P3B in which interlayer insulating layers formed of the protection layer 131 and the fifth material layers 153 and the conductive patterns 191 are alternately stacked, an interfacial pattern P2B formed of the third material layer 121 between the first stacked structure P1B and the second stacked structure P3B, a first pipe gate layer 101 formed under the first stacked structure P1B, and a second pipe gate layer 107 formed between the first pipe gate layer 101 and the first stacked structure P1B. The first stacked structure P1B, the interfacial pattern P2B, and the second stacked structure P3B may be separated into a drain-side stacked structure S1B and a source-side stacked structure S2B by the slit 181. In addition, the semiconductor device in accordance with the second embodiment of the present invention may further include a through-hole 165. The through-hole 165 includes first through-areas 141A and 141B passing through the first stacked structure P1B and the interfacial pattern P2B having first protrusions 143 protruding toward the interfacial pattern P2B, second through-areas 161A and 161B connected to the first through-areas 141A and 141B through the second stacked structure P3B, interconnections 147A and 147B connected to the first through-areas 141A and 141B through the second pipe gate layer 107 with a greater width than or the same width as the first through-areas 141A and 141B, and a trench 103 connected to the interconnections 147A and 147B in common and formed in the first pipe gate layer 101. In addition, the semiconductor device in accordance with the second embodiment of the present invention may further include a through-structure 170 formed along the through-hole 165 including the first protrusions 143.

As described above, a cell string of the semiconductor device in accordance with the second embodiment of the present invention may be formed to have the same structure as that of the cell string of the semiconductor device in accordance with the first embodiment of the present invention.

Figure 3A:
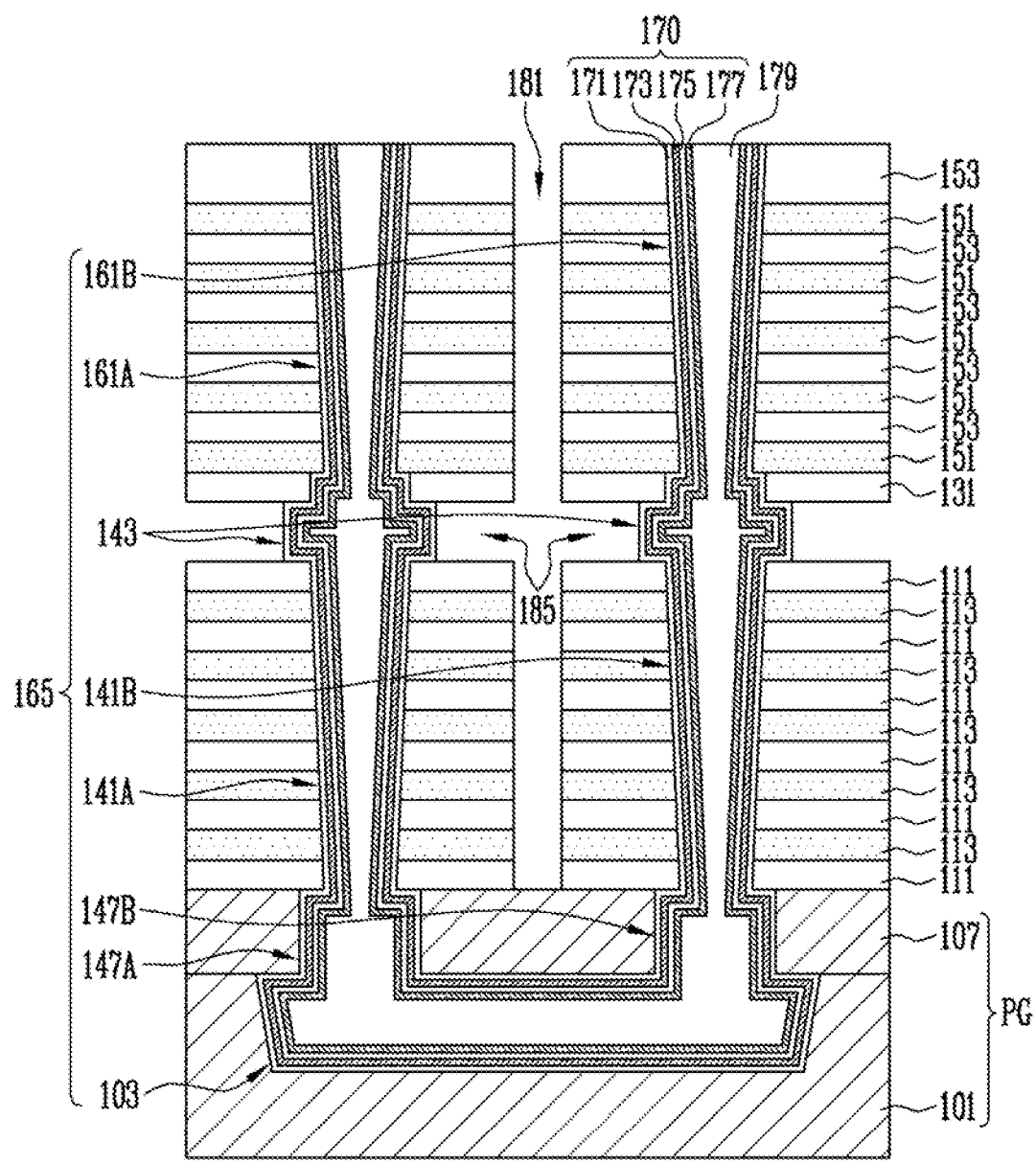
FIGS. 3A and 3B are cross-sectional views illustrating a semiconductor device according to a third embodiment of the present invention, and a method of manufacturing the same.
Figure 3B:
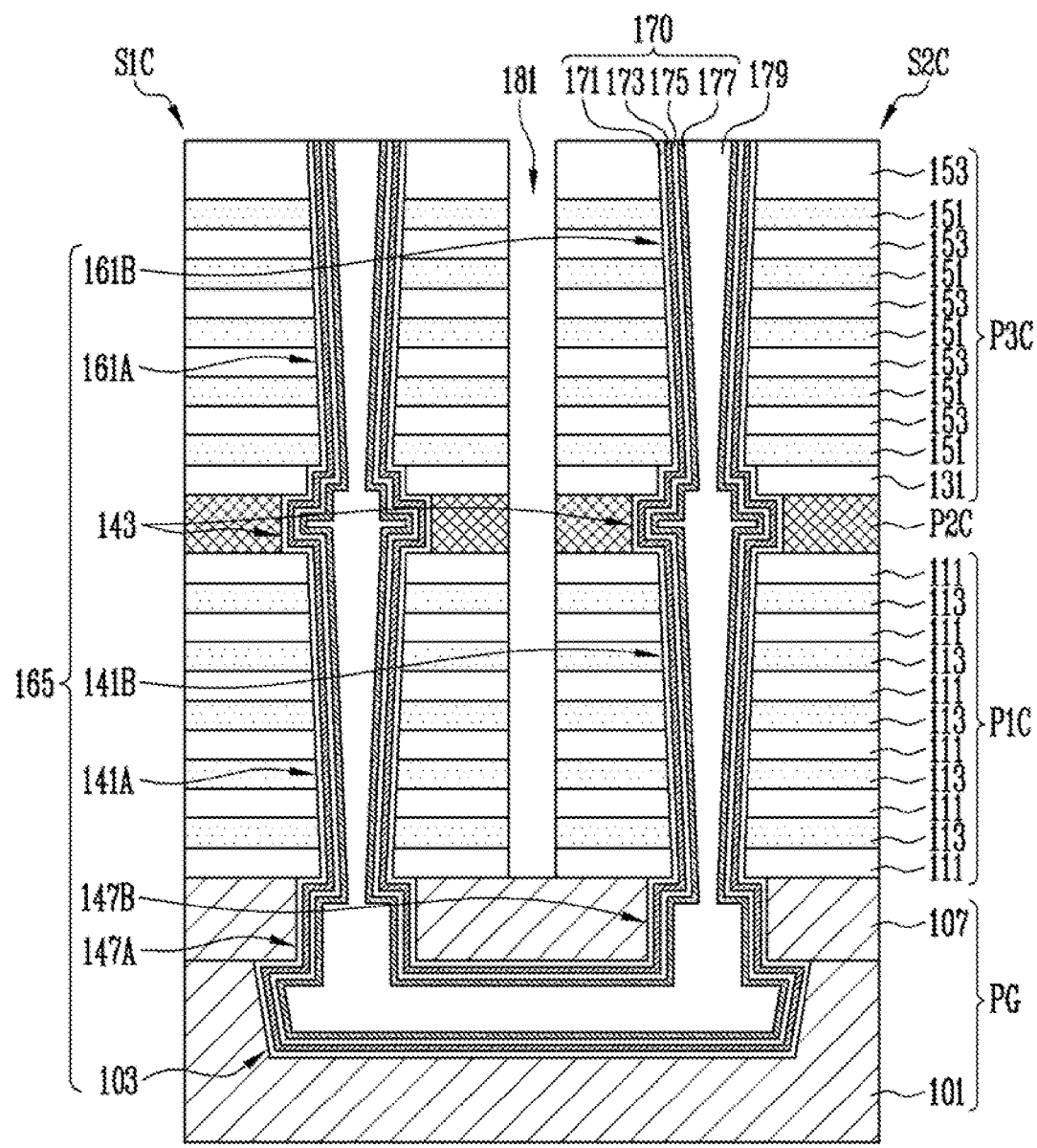

FIGS. 3A and 3B are cross-sectional views illustrating a semiconductor device and a method of manufacturing the same in accordance with a third embodiment of the present invention. In particular, FIGS. 3A and 3B are cross-sectional views illustrating other subsequent processes after the process of forming the slit 181 described in FIG. 1F. More specifically, FIGS. 3A and 3B shows an exemplary embodiment in which the first material layers 111 and the fifth material layers 153 are formed of an insulating material for an interlayer insulating layer, the second material layers 113 and the fourth material layers 151 are formed of a conductive material, and the third material layer 121 is formed of a sacrificial insulating material. Among the reference numerals in FIGS. 3A and 3B, reference numerals indicating the same configurations as described in FIGS. 1A to 1F are the same as the reference numerals of FIGS. 1A to 1F. Hereinafter, detailed descriptions thereof will be omitted for convenience.

Referring to FIG. 3A, the process in accordance with the third embodiment of the present invention includes forming the slit 181 and forming recess areas 185 by selectively removing the third material layer 121 that is formed of the sacrificial insulating material exposed by the slit 181.

Referring to FIG. 3B, interfacial patterns P2C are formed by filling the recess areas 185 with a conductive material. The conductive material for forming the interfacial patterns P2C may be the same material or a different material from the conductive material of the second and fourth material layers 113 and 151. For example, the interfacial patterns P2C and the second and fourth material layers 113 and 151 may be formed of a doped silicon layer or an undoped silicon layer. Otherwise, the second and fourth material layers 113 and 151 may be formed of a doped silicon layer or an undoped silicon layer and the interfacial patterns P2C may be formed of a metal such as tungsten (W), or a metal silicide layer.

The above-described semiconductor device in accordance with the third embodiment of the present invention includes a first stacked structure P1C, a second stacked structure P3C, a first pipe gate layer 101, a second pipe gate layer 107, a through-hole 165, and a through-structure 170, which are the same structures as those described in the first embodiment. In addition, the above-described semiconductor device in accordance with the third embodiment of the present invention may further include an interfacial pattern P2C formed of a conductive material between the first stacked structure P1C and the second stacked structure P3C. The first stacked structure P1C, the interfacial pattern P2C, and the second stacked structure P3C may be separated into a drain-side stacked structure S1C and a source-side stacked structure S2C by the slit 181.

As described above, a cell string of the semiconductor device in accordance with the third embodiment of the present invention may be formed to have the same structure as that of the cell string of the semiconductor device in accordance with the first embodiment of the present invention.

Figure 4A:
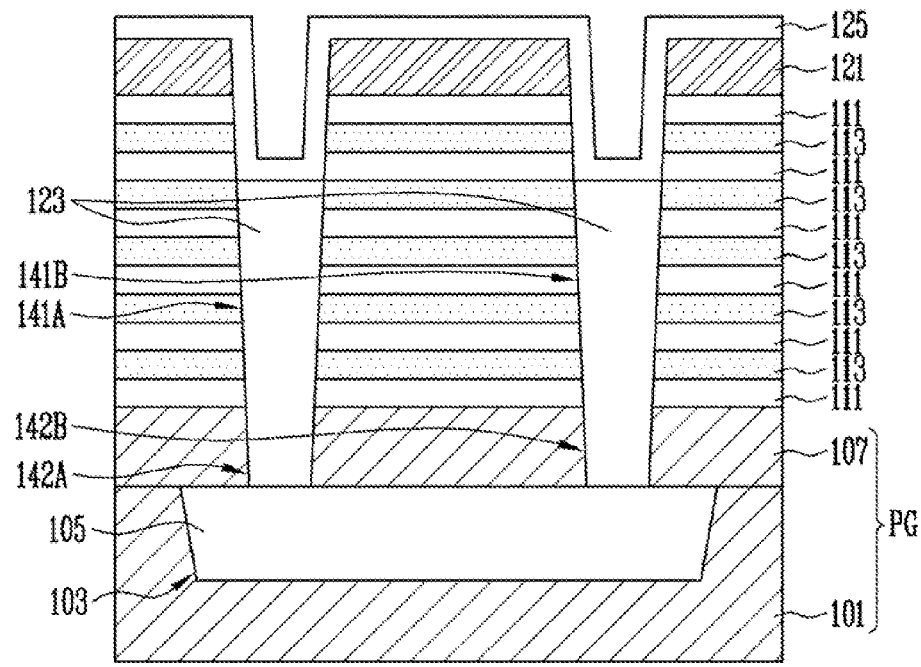
FIGS. 4A to 4D are cross-sectional views illustrating a semiconductor device according to a fourth embodiment of the present invention, and a method of manufacturing the same.
Figure 4B:
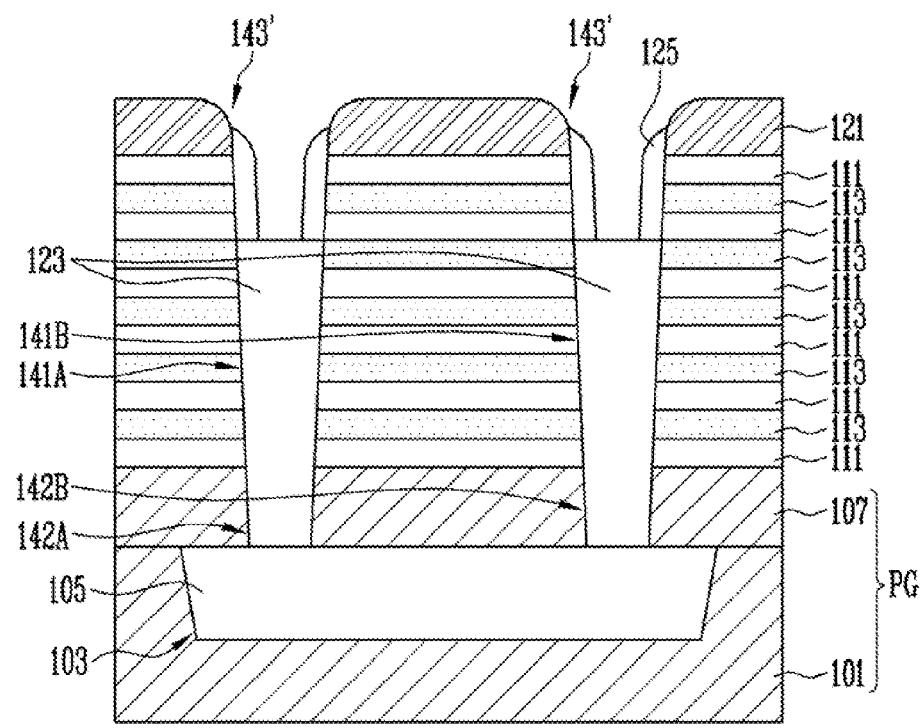

FIGS. 4A and 4B are cross-sectional views illustrating a semiconductor device and a method of manufacturing the same in accordance with a fourth embodiment of the present invention. In particular, FIGS. 4A and 4B are cross-sectional views illustrating another example of the process of forming the through-hole. Among the reference numerals in FIGS. 4A to 4D, reference numerals indicating the same configurations as described in FIGS. 1A to 1F are the same as the reference numerals of FIGS. 1A to 1F. Hereinafter, detailed descriptions thereof will be omitted for convenience.

Referring to FIG. 4A, a process of forming a pipe gate PG filled with a first sacrificial layer 105 on a substrate (not shown), a process of alternately stacking first material layers 111 and second material layers 113 on the pipe gate PG, and a process of forming a third material layer 121 are sequentially performed using the processes and materials described as in FIG. 1A. Next, first through-areas 141A and 141B passing through the third material layer 121, the first material layers 111, and the second material layers 113 are formed. At this time, preliminary interconnections 142A and 142B, connected to the first through-areas 141A and 141B and exposing the first sacrificial layer 105 are formed by further etching a second pipe gate layer 107 of the pipe gate PG. Horizontal cross-sections of the first through-areas 141A and 141B and the preliminary interconnections 142A and 142B may be formed in various shapes, such as a circle, an ellipse, and a polygon. The first through-areas 141A and 141B are also referred to as a drain-side first through-area 141A connected to an end of the trench 103, and a source-side first through-area 141B connected to the other end of the trench 103, respectively. The preliminary interconnections 142A and 142B are also referred to as a drain-side interconnection 142A connecting the drain-side first through-area 141A and the trench 103, and a source-side interconnection 142B connecting the source-side first through-area 141B and the trench 103.

Next, parts of the first through-areas 141A and 141B, and the inside of the preliminary interconnections 142A and 142B are filled with a gap-fill layer 123. The gap-fill layer 123 is formed in an area in which the first material layers 111 and the second material layers 113 are etched to expose an etched area of the third material layer 121. Here, at least one sidewall from the uppermost layer among the first material layers 111 and the second material layers 113 may be exposed. The gap-fill layer 123 may be formed of a material having an etch selectivity different from etch selectivities of the first to third material layers 111, 113, and 121, and a material layer of which gap-fill and removal are easy. For example, the gap-fill layer 123 may be formed of a spin-on-carbon (SOC) layer.

Next, a spacer layer 125 may be formed along the surface of the resulting structure in which the gap-fill layer 123 is formed. The thickness of the spacer layer 125 is set to open a center of the etched area of the third material layer 121.

Referring to FIG. 4B, the spacer layer 125 is etched using an anisotropic etching method to etch an upper sidewall of the third material layer 121. In the etching process, the spacer layer 125 remains on sidewalls of the first through-areas 141A and 141B and an upper surface of the third material layer 121 is exposed. In addition, protrusions 143' are formed on upper sidewalls of the first through-areas 141A and 141B. The protrusions 143' in accordance with the fourth embodiment of the present invention are grooves formed at an upper edge of the third material layer 121. The width of the first through-areas 141A and 141B is formed greater in an area where the protrusions 143' are formed than in the remainder.

Figure 4C:
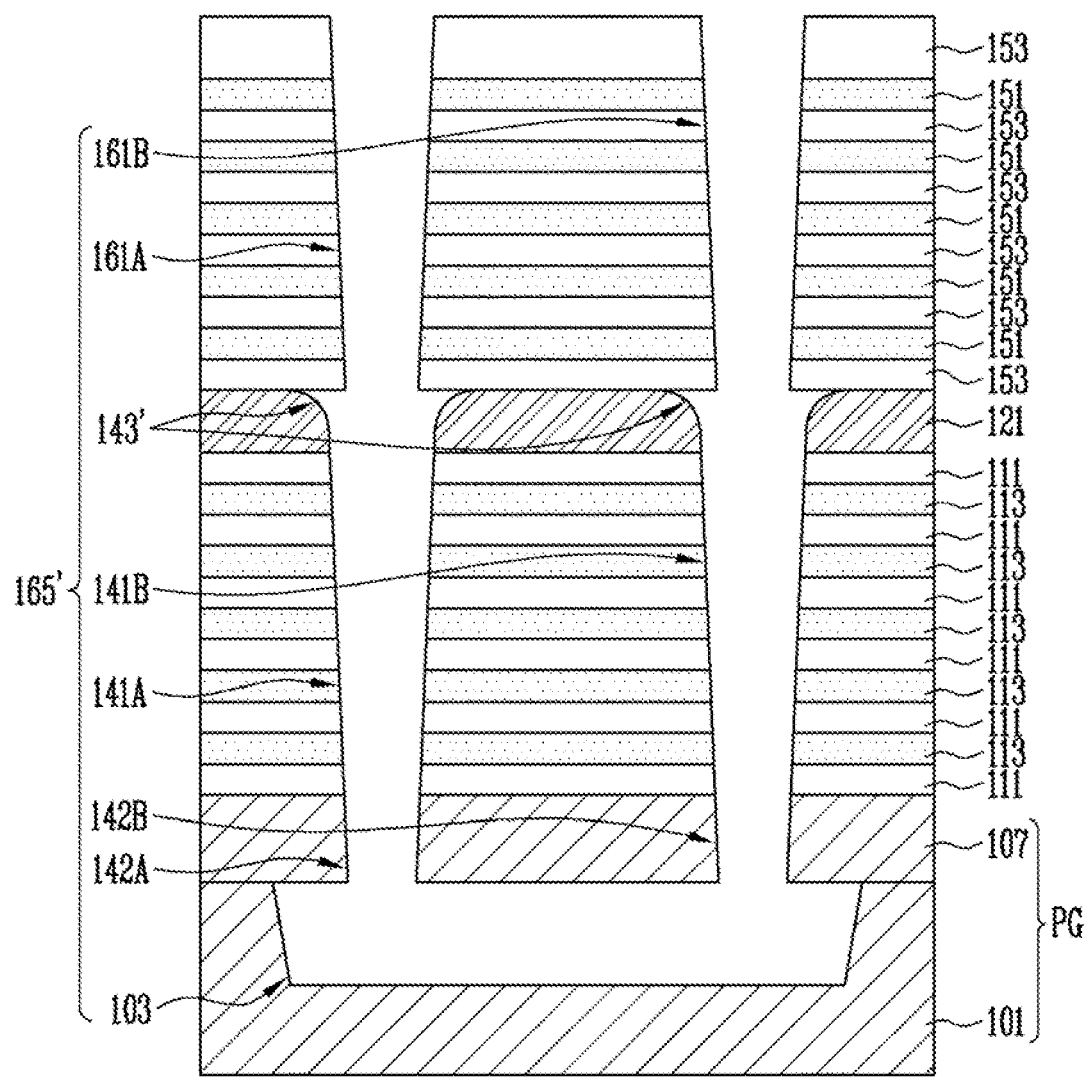

Referring to FIG. 4C, the remaining spacer layer 125 and gap-fill layer 123 are removed. Thereby, the first sacrificial layer (reference numeral 105 in FIG. 4B) is opened. Next, using the processes and materials described as in FIG. 1C, a process of filling the insides of the first through-areas 141A and 141B including the protrusions 143' and the preliminary interconnections 142A and 142B with a second sacrificial layers (not shown), a process of alternately stacking fourth material layers 151 and fifth material layers 153, and a process of forming second through-areas 161A and 161B connected to the first through-areas 141A and 141B, passing through the fourth material layers 151 and the fifth material layers 153, are sequentially performed. Here, the second through-areas 161A and 161B are formed in a state in which parts of the first through-areas 141A and 141B are widened by the protrusions 143'. Accordingly, in the fourth embodiment of the present invention, the second through-areas 161A and 161B may be easily connected to the first through-areas 141A and 141B by enlarging an overlay margin between the second through-areas 161A and 161B and the first through-areas 141A and 141B. In addition, in the fourth embodiment of the present invention, since the overlay margin between the second through-areas 161A and 161B and the first through-areas 141A and 141B is enlarged, the concern in which the first and second material layers 111 and 113 around the first through-areas 141A and 141B are damaged by the etching process for forming the second through-areas 161A and 161B may be reduced.

Next, the first through-areas 141A and 141B including the protrusions 143', the preliminary interconnections 142A and 142B, and the trench 103 are opened by selectively removing the second sacrificial layers and the first sacrificial layer (reference numeral 105 in FIG. 4B). Thereby, a through-hole 165' including the second through-areas 161A and 161B, the first through-areas 141A and 141B with the protrusions 143', the preliminary interconnections 142A and 142B, and the trench 103 is formed.

Figure 4D:
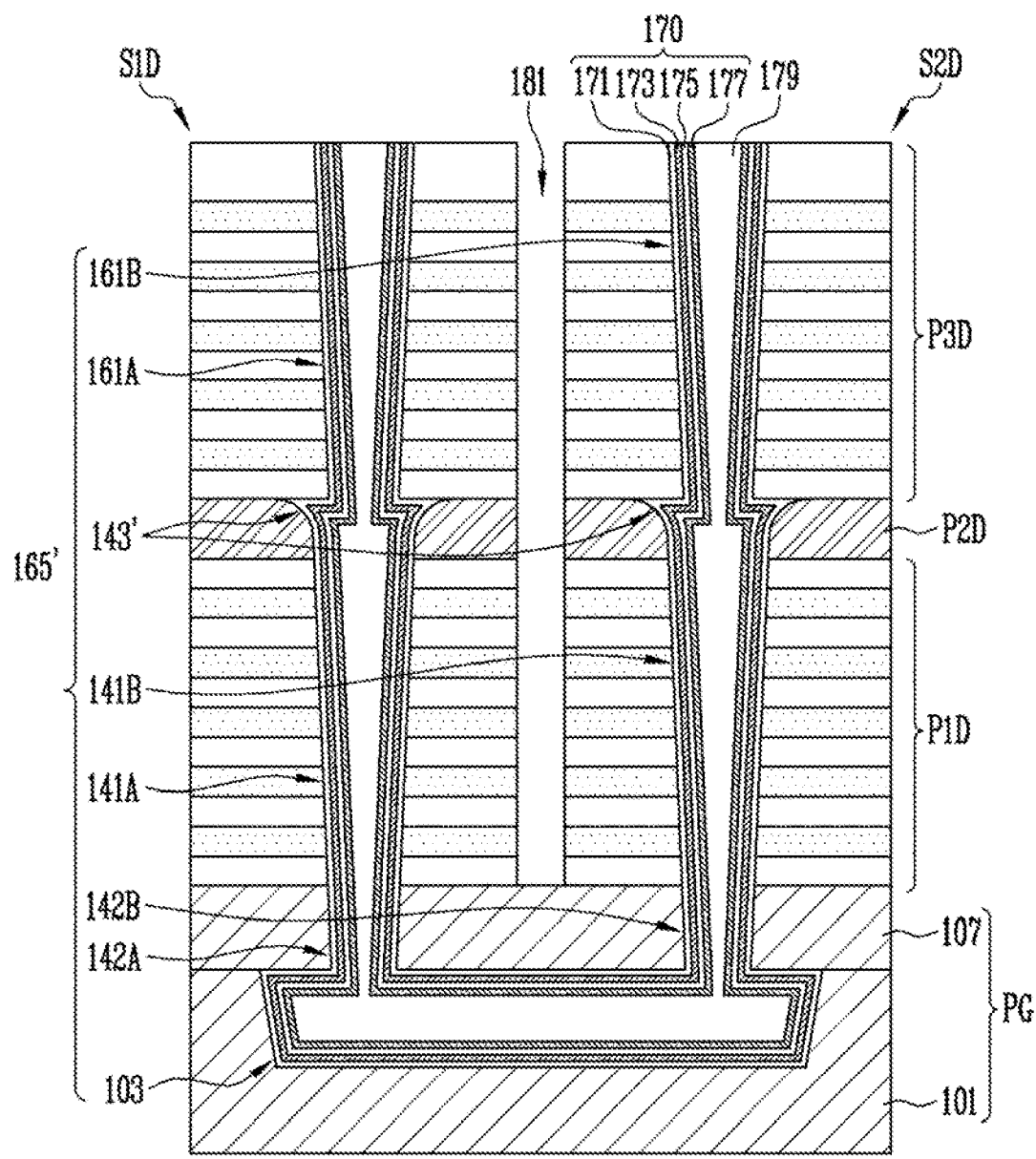

Referring to FIG. 4D, a through-structure 170 formed along the entire sidewall of the through-hole 165', and a slit 181 passing through the first to fifth material layers 111, 113, 121, 151, and 153 are formed using the processes and materials described as in FIG. 1F. The subsequent process may be performed using one of the processes of the first to third embodiments described as in FIGS. 1F to 3B.

The above-described semiconductor device in accordance with the fourth embodiment of the present invention includes a first stacked structure P1D in which interlayer insulating layers and conductive patterns are alternately stacked, a second stacked structure P3D in which interlayer insulating layers and conductive patterns are alternately stacked, an interfacial pattern P2D formed between the first stacked structure P1D and the second stacked structure P3D, a first pipe gate layer 101 formed under the first stacked structure P1D, and a second pipe gate layer 107 formed between the first pipe gate layer 101 and the first stacked structure P1D. The first stacked structure P1D, the interfacial pattern P2D, and the second stacked structure P3D may be separated into a drain-side stacked structure S1D and a source-side stacked structure S2D by the slit 181. In addition, the semiconductor device in accordance with the fourth embodiment of the present invention further includes a through-hole 165'. The through-hole 165' includes first through-areas 141A and 141B passing through the first stacked structure P1D and the interfacial pattern P2D and including protrusions 143' formed at an upper edge of the interfacial pattern P2D, second through-areas 161A and 161B connected to the first through-areas 141A and 141B through the second stacked structure P3D, preliminary interconnections 142A and 142B connected to the first through-areas 141A and 141B through the second pipe gate layer 107, and a trench 103 connected to the preliminary interconnections 142A and 142B in common and formed in the first pipe gate layer 101. In addition, the semiconductor device in accordance with the fourth embodiment of the present invention further includes a through-structure 170 formed along the through-hole 165' including the protrusions 143'.

As described above, a cell string of the semiconductor device in accordance with the fourth embodiment of the present invention may be formed to have the same structure as that of the cell string of the semiconductor device in accordance with the first embodiment of the present invention, except the shape of protrusions 143' of the through-hole 165' and the shape of the through-structure 170.

Figure 5:
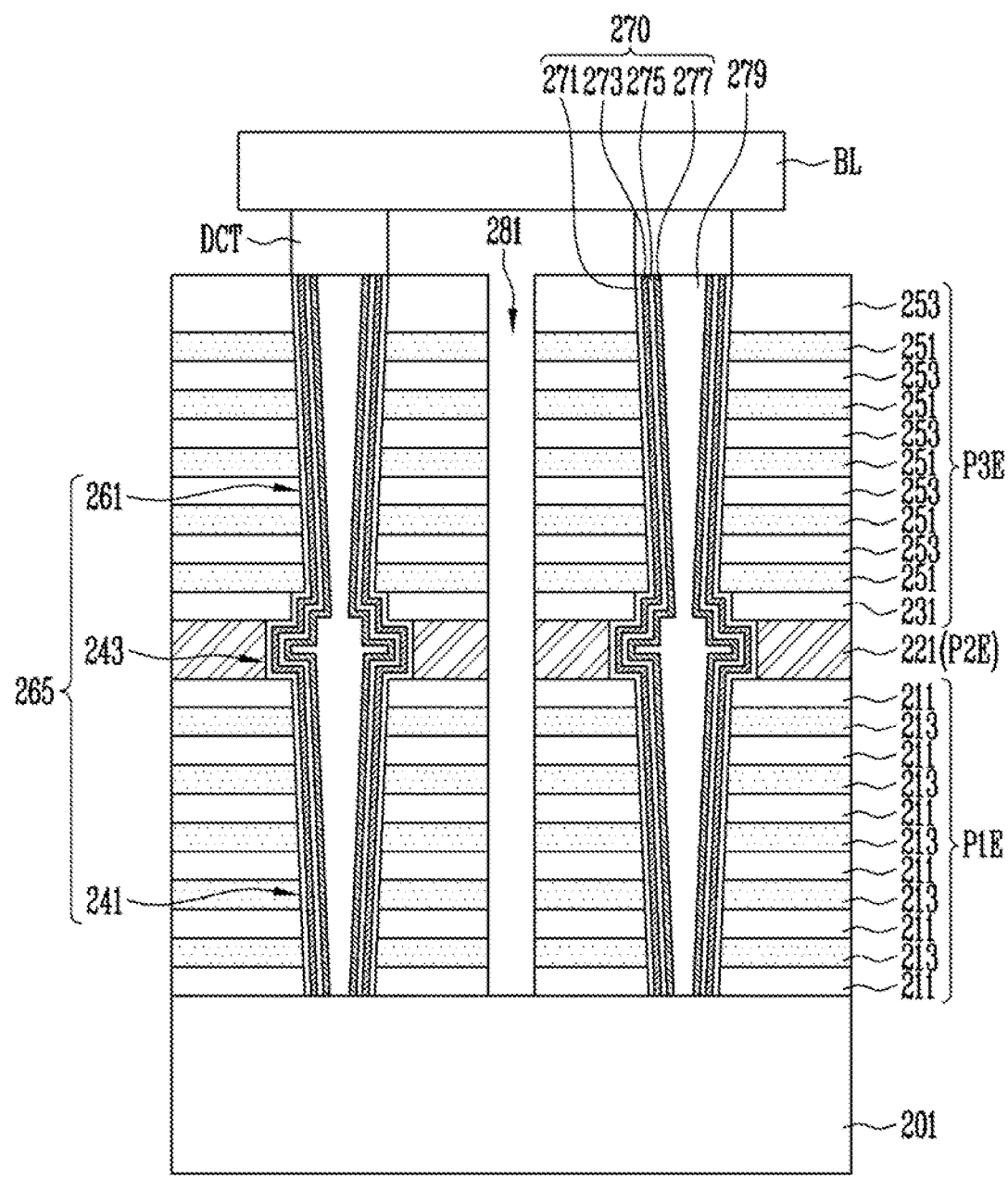
FIG. 5 is a cross-sectional view illustrating a semiconductor device according to a fifth embodiment of the present invention, and a method of manufacturing the same.

FIG. 5 is a cross-sectional view illustrating a semiconductor device and a method of manufacturing the same in accordance with a fifth embodiment of the present invention. In particular, the semiconductor device in accordance with the fifth embodiment of the present invention illustrated in FIG. 5 may be formed using the processes and materials described in FIGS. 1A to 1F. Hereinafter, detailed descriptions of the same duplicated effect as the first to fourth embodiments will be omitted.

Referring to FIG. 5, first material layers 211 and second material layers 213 are alternately stacked on a substrate 201. The substrate 201 may be a material having semiconductor characteristics. The substrate 201 includes a source area doped with impurities.

Next, a third material layer 221 is formed on the first material layers 211 and the second material layers 213. The first to third material layers 211, 213, and 221 may be formed using the same materials as the first to third material layers described as in FIG. 1A.

Next, a protection layer 231 may be further formed on the third material layer 221. The protection layer 231 may have the same function and material as those of the protection layer described in FIG. 1A. Next, a first through-area 241 passing through the protection layer 231, the third material layer 221, the first material layers 211, and the second material layers 213 is formed using the process described as in FIG. 1A.

Next, a protrusion 243 is formed on a sidewall of the first through-area 241 by selectively etching the third material layer 221 exposed through the first through-area 241 using the process described in FIG. 1B. The protrusion 243 is formed in such a manner that a part of the sidewall of the first through-area 241 in contact with the entire sidewall of the third material layer 221 protrudes toward the third material layer 221. The width of the first through-area 241 is greater in area where the protrusion 243 is formed than in the remainder.

Next, fourth material layers 251 and fifth material layers 253 through which a second through-area 261 passes are formed using the processes and materials as was described in reference to FIGS. 1C to 1E. Thereby, a through-hole 265 in accordance with the fifth embodiment of the present invention may be formed of the first through-area 241 including the protrusion 243, and the second through-area 261, and may be formed in a straight-type.

Next, a through-structure 270 may be formed along the entire sidewall of the through-hole 265 using the same processes and materials as described in reference to FIG. 1F. The through-structure 270 includes a blocking insulating layer 271, a data storage layer 273, a tunnel insulating layer 275, and a channel layer 277.

Next, a slit 281 passing through the first to fifth material layers 211, 213, 221, 251, and 253 and the protection layer 231 is formed. The subsequent process may be variously modified depending on material properties of the first to fifth material layers 211, 213, 221, 251, and 253.

First, when the first material layers 211 and the fifth material layers 253 are formed of an insulating material for an interlayer insulating layer, the second material layers 213 and the fourth material layers 251 are formed of a conductive material, and the third material layer 221 is formed of a conductive material or an insulating material, a subsequent process, such as a process of filling the inside of the slit 281 with an insulating material (not shown), a process of forming drain contact plugs DCT, and a process of forming a bit line BL, may be performed.

The above-described semiconductor device in accordance with the fifth embodiment of the present invention includes a first stacked structure P1E in which interlayer insulating layers formed of first material layers 211 and conductive patterns formed of second material layers 213 are alternately stacked, a second stacked structure P3E in which interlayer insulating layers formed of a protection layer 231 and fifth material layers 253 and conductive patterns formed of fourth material layers 251 are alternately stacked, and an interfacial pattern P2E formed of third material layer 221 between the first stacked structure P1E and the second stacked structure P3E. In addition, the semiconductor device in accordance with the fifth embodiment of the present invention further includes a through-hole 265 passing through the first stacked structure P1E, the interfacial pattern P2E, and the second stacked structure P3E, and a through-structure 270 formed along the through-hole 265. The through-hole 265 may be formed of a first through-area 241 passing through the first stacked structure P1E and the interfacial pattern P2E including a protrusion 243 protruding toward the sidewall of the interfacial pattern P2E, and a second through-area 261 passing through the second stacked structure P3E. A lower part of the channel layer 277 of the through-structure 270 may be connected to a source area of the substrate 201. An upper part of the channel layer 277 of the through-structure 270 may be connected to a bit line BL via a drain contact plug DCT.

As described above, a cell string of the semiconductor device in accordance with the fifth embodiment of the present invention may be formed in a straight type along the through-structure 270. The cell string may include a source select transistor, memory cell transistors, and a drain select transistor, which are connected in series along the through-structure 270. At least one conductive pattern from the lowermost layer among the second material layers 213, which are the conductive patterns of the first stacked structure P1E, may be used as a source select line, and at least one conductive pattern from the uppermost layer among the fourth material layers 251, which are the conductive patterns of the second stacked structure P3E, may be used as a drain select line. The source select transistor may be formed at an intersection of the through-structure 270 and the conductive pattern used as the source select line. The drain select transistor may be formed at an intersection of the through-structure 270 and the conductive pattern used as the drain select line. The memory cell transistors may be formed at intersections of the through-structure 270 and the second and fourth material layers 213 and 251 between the drain select transistor and the source select transistor.

Figure 6:
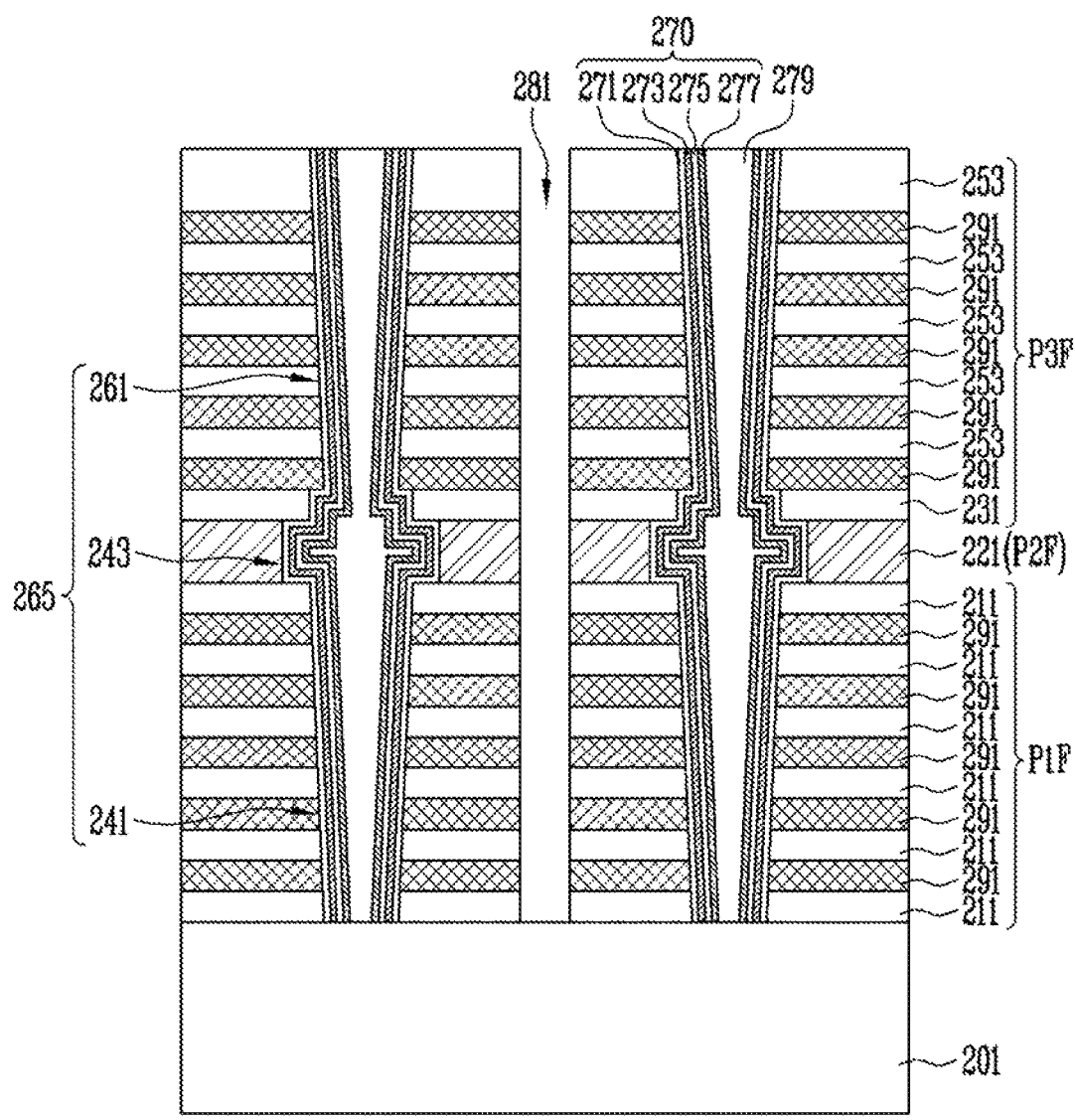
FIG. 6 is a cross-sectional view illustrating a semiconductor device according to a sixth embodiment of the present invention, and a method of manufacturing the same.

FIG. 6 is a cross-sectional view illustrating a semiconductor device and a method of manufacturing the same in accordance with a sixth embodiment of the present invention. In particular, FIG. 6 is a cross-sectional view illustrating other subsequent processes following the process of forming the slit 281 described in FIG. 5. More specifically, FIG. 6 shows an exemplary embodiment in which first material layers 211 and fifth material layers 253 are formed of an insulating material for an interlayer insulating layer, and second material layers 213 and fourth material layers 251 are formed of a sacrificial material. Among the reference numerals in FIG. 6, reference numerals indicating the same configurations as described in FIG. 5 are the same as the reference numerals of FIG. 5. Hereinafter, detailed descriptions thereof will be omitted for convenience.

Referring to FIG. 6, in the sixth embodiment of the present invention, recess areas are formed by selectively removing the second material layers 213 and the fourth material layers 251, which are formed of the sacrificial material, exposed through the slit 281. Next, conductive patterns 291 are formed in the recess areas using the same material and process as described in FIG. 2B.

The above-described semiconductor device in accordance with the sixth embodiment of the present invention includes a first stacked structure P1F in which interlayer insulating layers formed of the first material layers 211 and the conductive patterns 291 are alternately stacked, a second stacked structure P3F in which interlayer insulating layers formed of the protection layer 231 and the fifth material layers 253 and the conductive patterns 291 are alternately stacked, and an interfacial pattern P2F formed of a third material layer 221 between the first stacked structure P1F and the second stacked structure P3F. In addition, the semiconductor device in accordance with the sixth embodiment of the present invention further includes a through-hole 265 and a through-structure 270 having the same structures as those described in the fifth embodiment of the present invention.

As described above, a cell string of the semiconductor device in accordance with the sixth embodiment of the present invention may be formed to have the same structure as that of the cell string of the semiconductor device in accordance with the fifth embodiment of the present invention.

Figure 7:
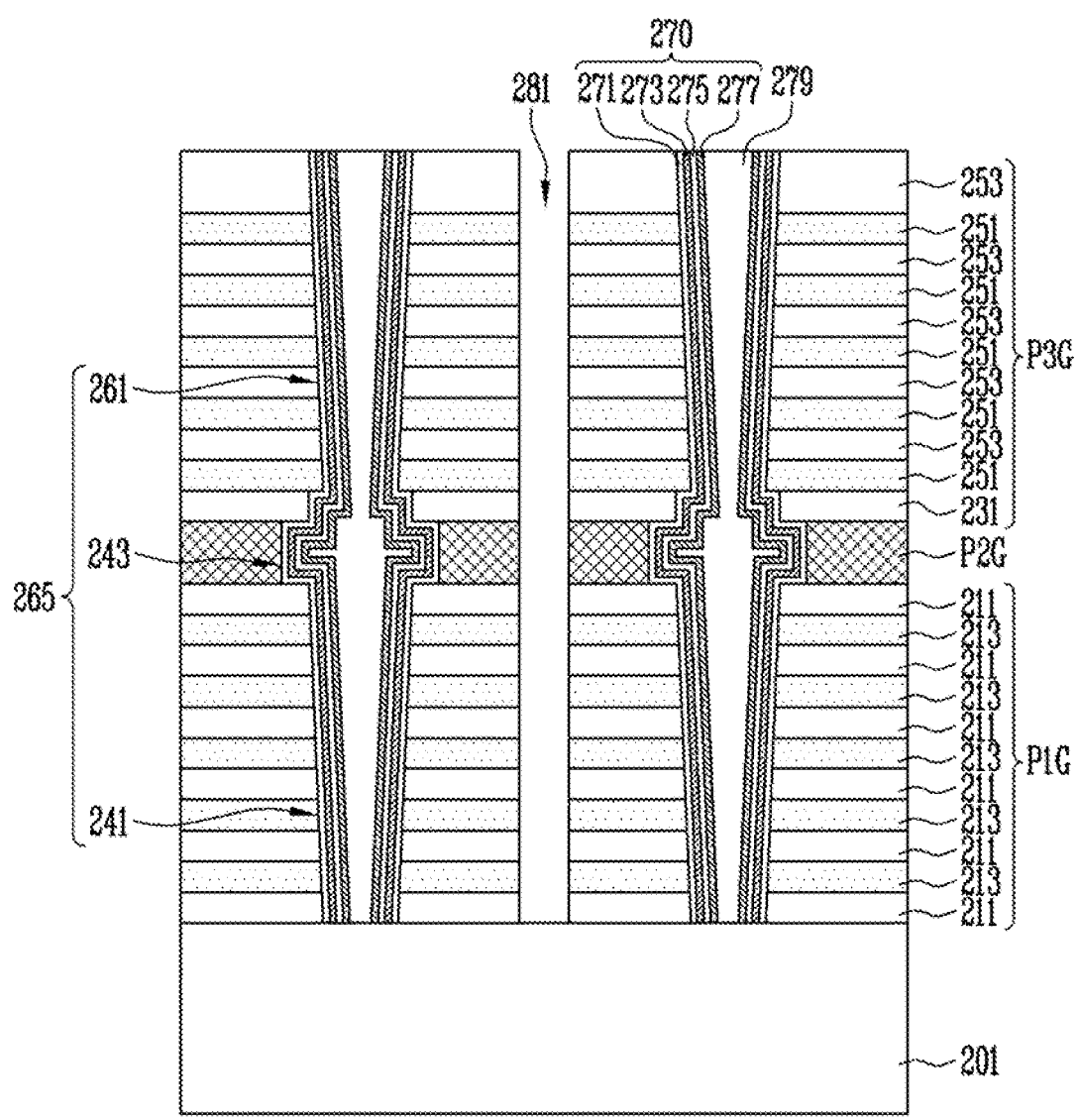
FIG. 7 is a cross-sectional view illustrating a semiconductor device according to a seventh embodiment of the present invention, and a method of manufacturing the same.

FIG. 7 is a cross-sectional view illustrating a semiconductor device and a method of manufacturing the same in accordance with a seventh embodiment of the present invention. In particular, FIG. 7 is a cross-sectional view illustrating other subsequent processes following the process of forming the slit 281 described in FIG. 5. More specifically, FIG. 7 shows an exemplary embodiment in which first material layers 211 and fifth material layers 253 are formed of an insulating material for an interlayer insulating layer, second material layers 213 and fourth material layers 251 are formed of a conductive material, and the third material layer (reference numeral 221 in FIG. 5) is formed of a sacrificial insulating material. Among the reference numerals in FIG. 7, reference numerals indicating the same configurations as described in FIG. 5 are the same as the reference numerals of FIG. 5. Hereinafter, detailed descriptions thereof will be omitted for convenience.

Referring to FIG. 7, in the seventh embodiment of the present invention, a recess area is formed by selectively removing the third material layer (reference numeral 221 in FIG. 5) that is formed of the sacrificial insulating material exposed through the slit 281. Next, an interfacial pattern P2G is formed in the recess area using the process and material as was described in reference to FIG. 3B.

The above-described semiconductor device in accordance with the seventh embodiment of the present invention includes a first stacked structure P1G, a second stacked structure P3G, a through-hole 265, and a through-structure 270, which have the same structures as those described in the fifth embodiment of the present invention. In addition, the semiconductor device in accordance with the seventh embodiment of the present invention further includes the interfacial pattern P2G formed of a conductive material between the first stacked structure P1G and the second stacked structure P3G.

As described above, a cell string of a semiconductor device in accordance with the seventh embodiment of the present invention may be formed to have the same structure as that of the cell string of the semiconductor device in accordance with the fifth embodiment of the present invention.

Figure 8:
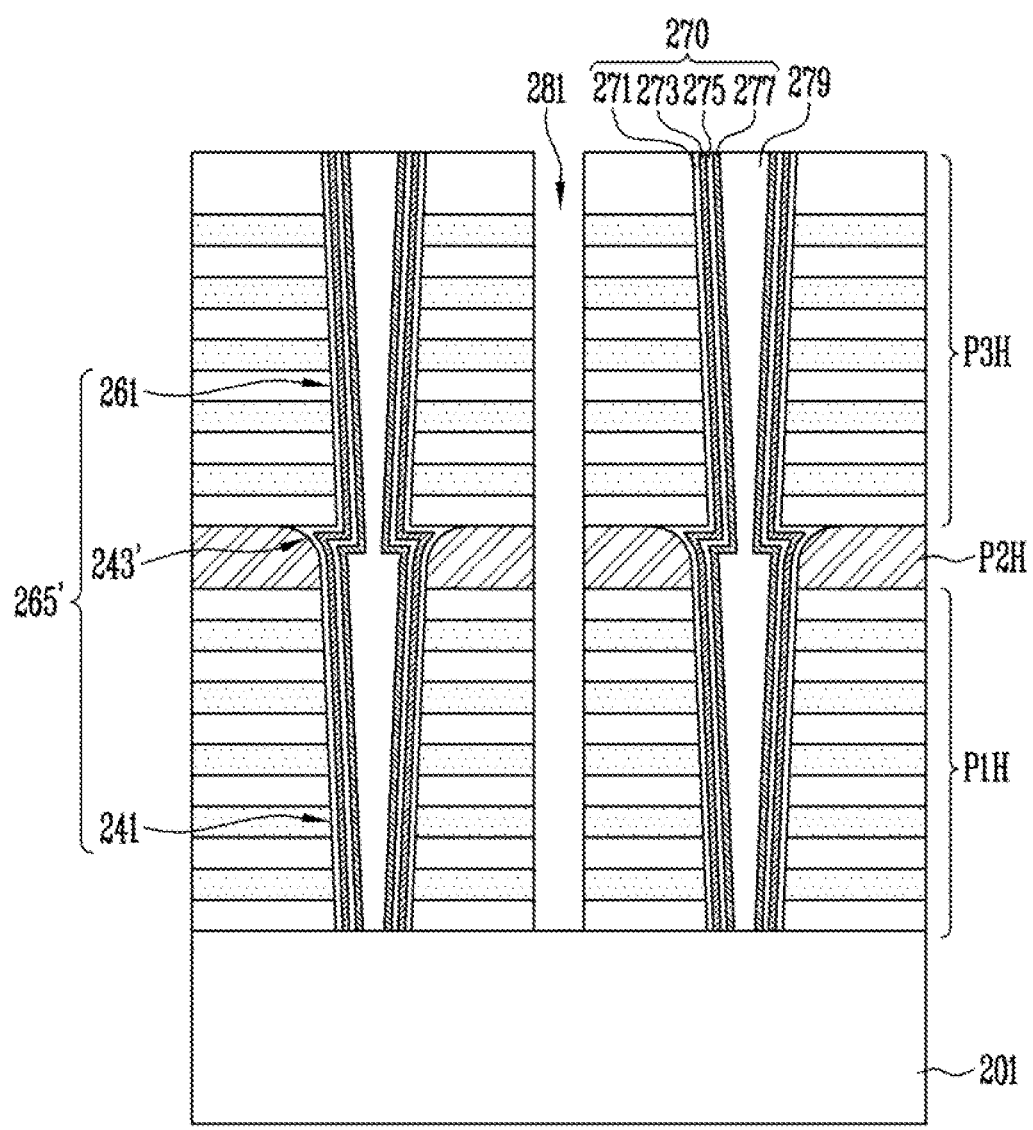
FIG. 8 is a cross-sectional view illustrating a semiconductor device according to an eighth embodiment of the present invention, and a method of manufacturing the same.

FIG. 8 is a cross-sectional view illustrating a semiconductor device and a method of manufacturing the same in accordance with an eighth embodiment of the present invention. In particular, FIG. 8 is a cross-sectional view illustrating another example of a process of forming a through-hole. Among the reference numerals in FIG. 8, reference numerals indicating the same configurations as described in FIG. 5 are the same as the reference numerals of FIG. 5. Hereinafter, detailed descriptions thereof will be omitted for convenience.

Referring to FIG. 8, first material layers, second material layers, and a third material layer, through which a first through-area 241 passes, are formed on a substrate 201 including a source area (not shown) using the processes and materials described in FIG. 5.

Next, a protrusion 243' is formed on an upper edge of the first through-area 241 using the processes described in reference to FIGS. 4A and 4B. Next, fourth material layers and fifth material layers, through which a second through-area 261 passes, are formed using the processes described as in FIG. 4C. Thereby, a through-hole 265' including a second through-area 261 and a first through-area 241 having the protrusion 243' is formed.

Next, a through-structure 270 along the entire sidewall of the through-hole 265' and a slit 281 passing through the first to fifth material layers are formed using the processes and materials described as in FIG. 1F. The subsequent process may be performed using the processes of the first to third embodiments as described in reference to FIGS. 1F to 3B.

The above described semiconductor device in accordance with the eighth embodiment of the present invention includes a first stacked structure P1H in which interlayer insulating layers and conductive patterns are alternately stacked, a second stacked structure P3H in which interlayer insulating layers and conductive patterns are alternately stacked, and an interfacial pattern P2H formed between the first stacked structure P1H and the second stacked structure P3H. In addition, the semiconductor device in accordance with the eighth embodiment of the present invention further includes the through-hole 265' passing through the first stacked structure P1H, the interfacial pattern P2H, the second stacked structure P3H, and the through-structure 270 formed along the through-hole 265'. The through-hole 265' includes the first through-area 241 passing through the first stacked structure P1H, the interfacial pattern P2H and including the protrusions 243' formed on an upper edge of the interfacial pattern P2H, and the second through-area 261 connected to the first through-area 241 through the second stacked structure P3H.

As described above, a cell string of the semiconductor device in accordance with the eighth embodiment of the present invention may be formed to have the same structure as that of the cell string of the semiconductor device in accordance with the fifth embodiment of the present invention, except the shape of the protrusions 243' of the through-hole 265' and the shape of the through-structure 270.

Figure 9:
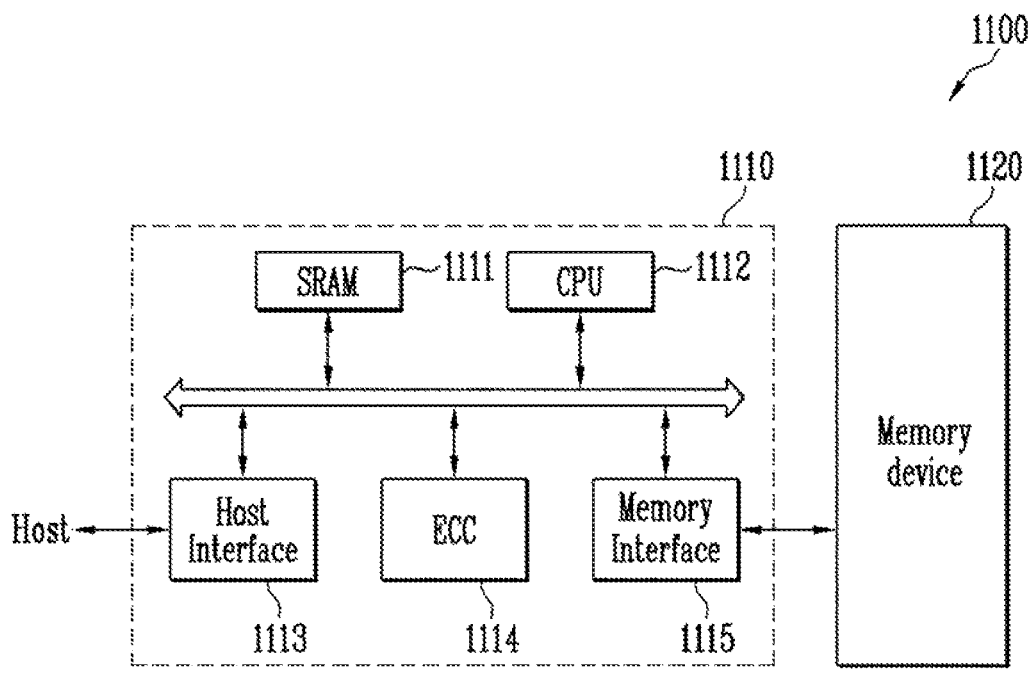
FIG. 9 is a configuration diagram showing a memory system in accordance with an embodiment of the present invention.

FIG. 9 is a configuration diagram showing a memory system in accordance with an embodiment of the present invention.

Referring to FIG. 9, a memory system 1100 in accordance with the embodiment of the present invention includes a memory device 1120 and a memory controller 1110.

The memory device 1120 includes the cell string described with reference to FIGS. 1A to 8. In addition, the memory device 1120 may be a multi-chip package formed of a plurality of flash memory chips.

The memory controller 1110 is suitable for controlling the memory device 1120, and may include an SRAM 1111, a CPU 1112, a host interface 1113, an ECC 1114, and a memory interface 1115. The SRAM 1111 is used as operation memory of the CPU 1112. The CPU 1112 performs the overall control operations for data exchange of the memory controller 1110 and the host interface 1113 includes the data exchange protocol of a host connected to the memory system 1100. In addition, the ECC 1114 detects and corrects errors included in data read from the memory device 1120 and the memory interface 1115 performs interfacing with the memory device 1120. Additionally, the memory controller 1110 may further include a ROM that stores code data for interfacing with the host.

The memory system 1100 having the above-described configuration may be a memory card in which the memory device 1120 and the controller 1110 are combined or a solid state disk (SSD). For example, when the memory system 1100 is an SSD, the memory controller 1110 may communicate with an external apparatus (for example, a host) through various interface protocols, such as a USB, an MMC, a PCI-E, a SATA, a PATA, an SCSI, an ESDI, and an IDE.

Figure 10:
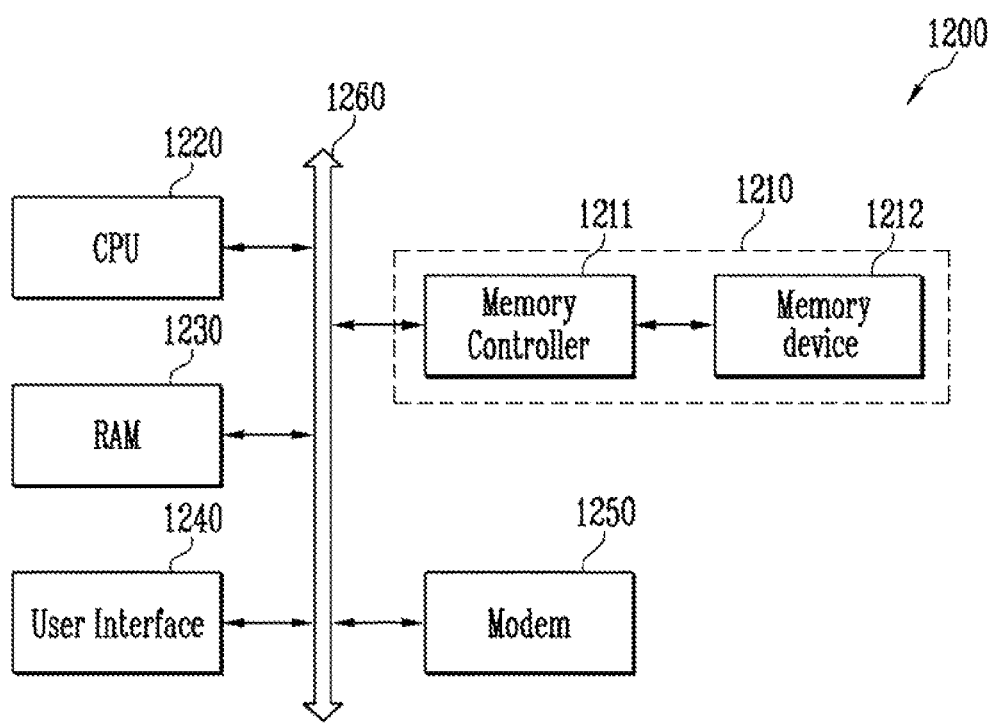
FIG. 10 is a configuration diagram showing a computing system in accordance with an embodiment of the present invention.

FIG. 10 is a configuration diagram showing a computing system in accordance with an embodiment of the present invention.

Referring to FIG. 10, a computing system 1200 in accordance with the embodiment of the present invention may include a CPU 1220, a RAM 1230, a user interface 1240, a modem 1250, and a memory system 1210, which are electrically connected to a system bus 1260. In addition, when the computing system 1200 is a mobile apparatus, the computing system 1200 may further include a battery for supplying an operation voltage to the computing system 1200, an application chipset, a camera image processor (CIS), a mobile DRAM, etc.

The memory system 1210 may be formed of a memory device 1212 and a memory controller 1211, as described above with reference to FIG. 9.

According to the embodiments of the present invention, through-structures may be easily formed without being divided into parts.

According to the embodiments of the present invention, since a part of the first through-area passing through the interfacial pattern between the stacked structures is formed wide, an overlay margin between the first through-area and the second through-area that is to be formed in the subsequent process is enlarged, and thereby the second through-area may be easily connected to the first through-area.

According to the embodiments of the present invention, since the overlay margin between the first through-area and the second through-area is enlarged, damage of the stacked structure disposed under the second through-area due to the process for forming the second through-area may be reduced.

According to the embodiments of the present invention, since a through-hole passing through stacked structures is formed by dividing it into parts, the through-hole may be formed wide toward its bottom. According to the embodiments of the present invention, narrowness of a through-structure formed along the through-hole may be prevented.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A semiconductor device, comprising:
a first stacked structure in which first conductive patterns and first interlayer insulating layers are alternately stacked;
a second stacked structure formed on the first stacked structure and including second conductive patterns and second interlayer insulating layers, which are alternately stacked;
an interfacial pattern formed between the first stacked structure and the second stacked structure;
first through-areas passing through the first stacked structure and the interfacial pattern and including first protrusions protruding toward a sidewall of the interfacial pattern;
second through-areas passing through the second stacked structure and connected to the first through-areas; and
through-structures formed along sidewalls of the first through-areas and the second through-areas,
wherein the first protrusions define depressions on sidewalls of the first through-areas, the depressions more protruding toward a lateral direction than entire sidewalls of the second through-areas,
wherein the through-structures are formed such that the first conductive patterns and the first interlayer insulating layers between a lowermost layer and an uppermost layer of the first stacked structure have the same structure as the second conductive patterns and the second interlayer insulating layers between a lowermost layer and an uppermost layer of the second stacked structures,
wherein each of the first protrusions and the depressions has a top surface in direct contact with the lowermost layer of the second stacked structure and a bottom surface in direct contact with the uppermost layer of the first stacked structure,
wherein the interfacial pattern is formed of a conductive material, or is formed of an insulating material having an etch selectivity different from etch selectivities of the first and second conductive patterns and the first and second interlayer insulating layers; and wherein at least one conductive pattern from an uppermost layer among the second conductive patterns is a drain select line, and at least one conductive pattern from a lowermost layer among the first conductive patterns is a source select line.

2. The semiconductor device of claim 1, wherein each of the through-structures includes a channel layer.

3. The semiconductor device of claim 2, further comprising:
a bit line connected to an upper part of the channel layer; and
a source area connected to a lower part of the channel layer.

4. The semiconductor device of claim 2, wherein each of the through-structures further includes a tunnel insulating layer surrounding the channel layer, a data storage layer surrounding the tunnel insulating layer, and a blocking insulating layer surrounding the data storage layer.

5. The semiconductor device of claim 1, further comprising a slit passing through the first stacked structure, the second stacked structure and the interfacial pattern,
wherein the slit is interposed between adjacent first through-areas and between adjacent second through-areas corresponding to the adjacent first through-areas.

6. The semiconductor device of claim 1, wherein the interfacial pattern is formed thicker than a conductive pattern adjacent to the interfacial pattern among the first conductive patterns.

7. The semiconductor device of claim 1, wherein the lowermost layer of the second stacked structure is a protection layer and is in direct contact with the interfacial pattern.

8. The semiconductor device of claim 7, wherein the first through-area further passes through the protection layer.

9. The semiconductor device of claim 7, wherein the protection layer is formed of the same material layer as the first interlayer insulating layers.

10. The semiconductor device of claim 1, wherein the through-structures are in direct contact with sidewalls of the second conductive patterns and sidewalls of the second interlayer insulating layers.

11. A semiconductor device, comprising:
a first stacked structure in which first conductive patterns and first interlayer insulating layers are alternately stacked in a first direction;
a second stacked structure formed on the first stacked structure and including second conductive patterns and second interlayer insulating layers, which are alternately stacked in the first direction;
an interfacial pattern formed between the first stacked structure and the second stacked structure;
first through-areas passing through the first stacked structure and the interfacial pattern;
first protrusions protruding toward sidewalls of the interfacial pattern from the first through-areas; and
second through-areas passing through the second stacked structure and connected to the first through-areas,
wherein sidewalls of the first protrusions measured from the sidewalls of the interfacial pattern more protrude toward a lateral direction than sidewalls of the second through-areas measured from sidewalls of the second conductive patterns and sidewalls of the second interlayer insulating layers,
wherein each of the first protrusions has a top surface facing a top surface of the first stacked structure in the first direction, and a bottom surface facing a bottom surface of the second stacked structure in the first direction,
wherein the interfacial pattern is formed of a conductive material, or is formed of an insulating material having an etch selectivity different from etch selectivities of the first and second conductive patterns and the first and second interlayer insulating layers; and
wherein at least one conductive pattern from an uppermost layer among the second conductive patterns is a drain select line, and at least one conductive pattern from a lowermost layer among the first conductive patterns is a source select line.

\* \* \* \* \*